United States Patent [19]

Hasegawa et al.

[11] Patent Number: 5,654,912
[45] Date of Patent: Aug. 5, 1997

[54] SEMICONDUCTOR MEMORY DEVICE WITH REDUCED READ TIME AND POWER CONSUMPTION

[75] Inventors: Takehiro Hasegawa; Yukihito Oowaki, both of Yokohama; Hitoshi Kuyama, Kawasaki, all of Japan

[73] Assignee: Kabushiki Kaisha Toshiba, Kawasaki, Japan

[21] Appl. No.: 568,500

[22] Filed: Dec. 7, 1995

[30] Foreign Application Priority Data

Dec. 7, 1994 [JP] Japan .................................. 6-304039

[51] Int. Cl.$^6$ .................................................. G11C 11/24
[52] U.S. Cl. ................ 365/149; 365/189.12; 365/230.03
[58] Field of Search ............................ 365/149, 189.12, 365/205, 190, 230.03

[56] References Cited

U.S. PATENT DOCUMENTS

| | | | |
|---|---|---|---|
| 5,369,612 | 11/1994 | Furuyama | 365/189.05 |
| 5,418,750 | 5/1995 | Shiratake et al. | 365/206 |
| 5,467,303 | 11/1995 | Hasegawa et al. | 365/149 |
| 5,477,071 | 12/1995 | Hamamoto et al. | 257/302 |
| 5,537,347 | 7/1996 | Shiratake | 365/149 |

OTHER PUBLICATIONS

1993 Symposium on VLSI Circuits Digest of Technical Papers, pp. 59–60, May 1993, Y. Takai, et al., "250MBYTE/SEC Synchronous DRAM Using a 3–Stage–Pipelined Architecture".

1991 IEEE International Solid Stats Circuits Conference, pp. 106–107 and 297, Katsutaka Kimura, et al., "A Block–Oriented RAM with Half–Sized DRAM Cell and Quasi–Folded Data–Line Architecture".

*Primary Examiner*—David C. Nelms
*Assistant Examiner*—Son Mai
*Attorney, Agent, or Firm*—Oblon, Spivak, McClelland, Maier & Neustadt, P.C.

[57] ABSTRACT

A semiconductor memory device comprises a memory array in which word lines are driven by a single decoder or a plurality of memory arrays driven by a plurality of decoders operating with the same row address, in the memory array or memory arrays memory cell units in which a plurality of memory cells are connected in series being arranged in the form of an array, a plurality of sense amplifier arrays constituted by arranging a plurality of sense amplifiers each provided for a pair of bit lines or a plurality of pairs of bit lines to read out data from the memory cells of the memory cell arrays, the sense amplifier arrays being divided into a plurality of blocks, and the blocks corresponding to one memory cell array, a register array having a plurality of registers for storing data read out by the plurality of sense amplifiers, the register array being divided into a plurality of blocks, and the blocks corresponding to the sense amplifier block and one memory cell array, and a control circuit for independently controlling the blocks of the sense amplifier arrays and the register array and independently reading out data from the registers in the blocks.

11 Claims, 20 Drawing Sheets

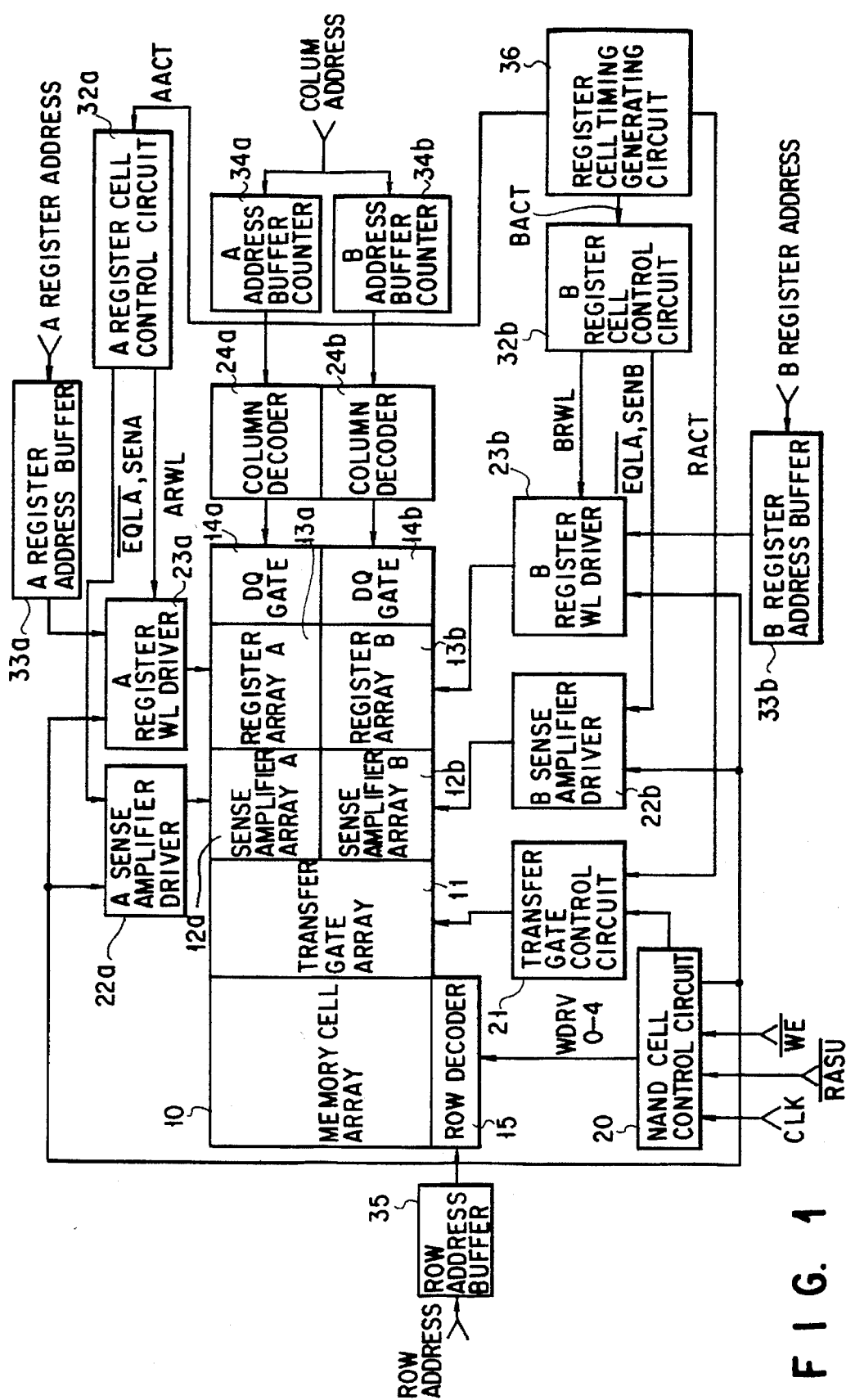
F I G. 1

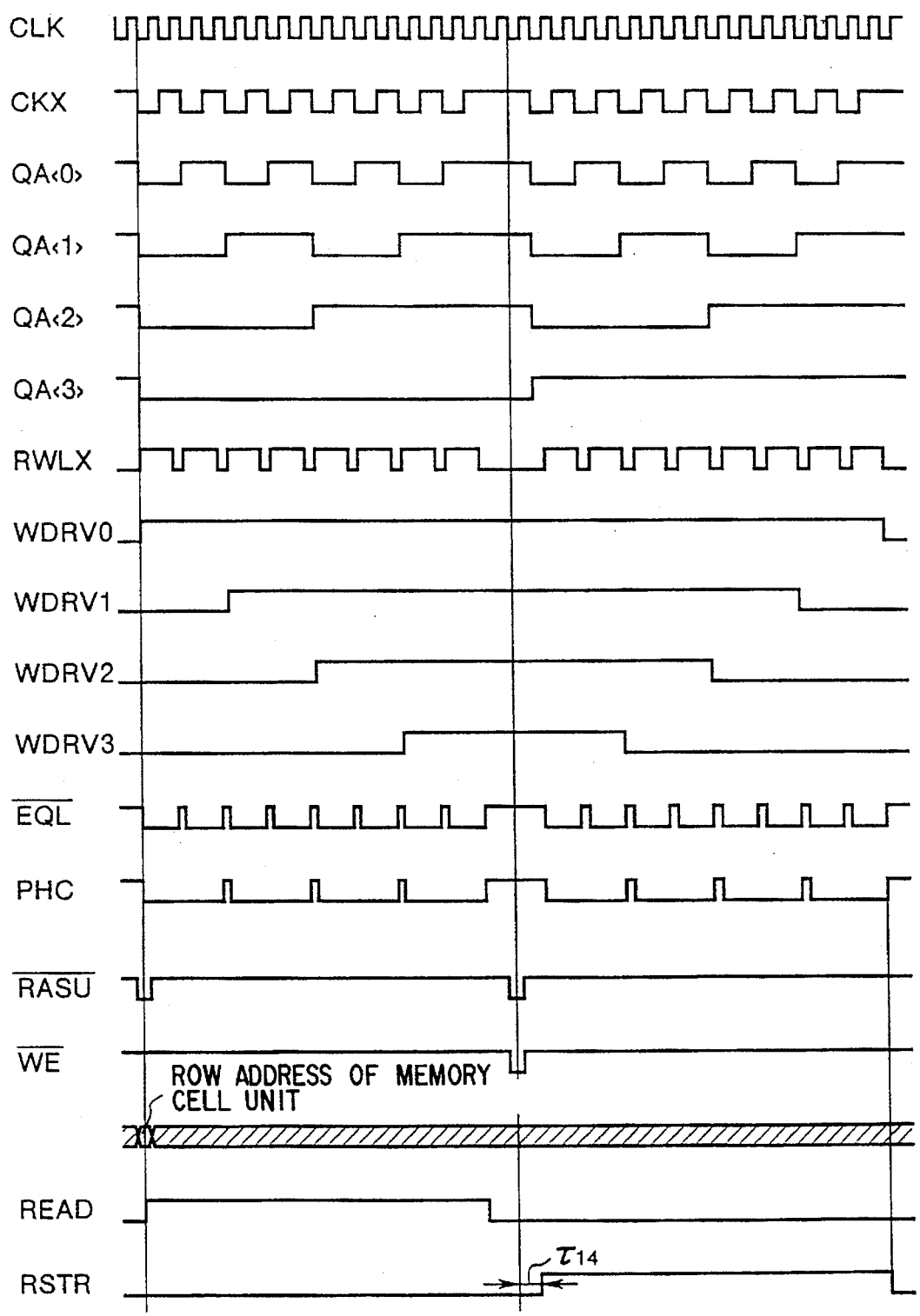
F I G. 4

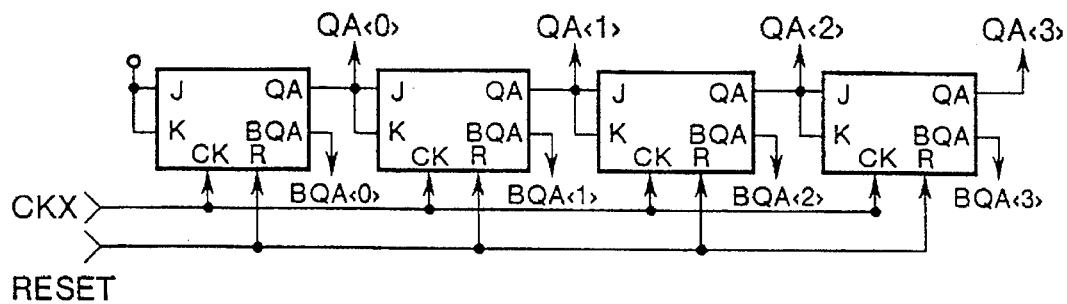
FIG. 5A
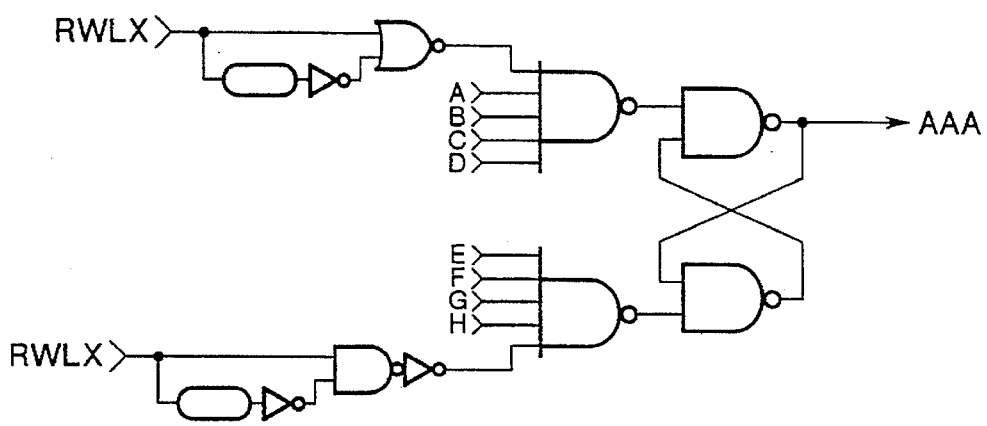
FIG. 5B
| A | B | C | D | E | F | G | H | AAA |
|---|---|---|---|---|---|---|---|---|
| BQA<0> | BQA<1> | BQA<2> | BQA<3> | QA<0> | QA<1> | QA<2> | QA<3> | WDRV0 |
| BQA<0> | QA<1> | BQA<2> | BQA<3> | QA<0> | BQA<1> | QA<2> | QA<3> | WDRV1 |
| BQA<0> | BQA<1> | QA<2> | BQA<3> | QA<0> | QA<1> | BQA<2> | QA<3> | WDRV2 |
| BQA<0> | QA<1> | QA<2> | BQA<3> | QA<0> | BQA<1> | BQA<2> | QA<3> | WDRV3 |
FIG. 5C

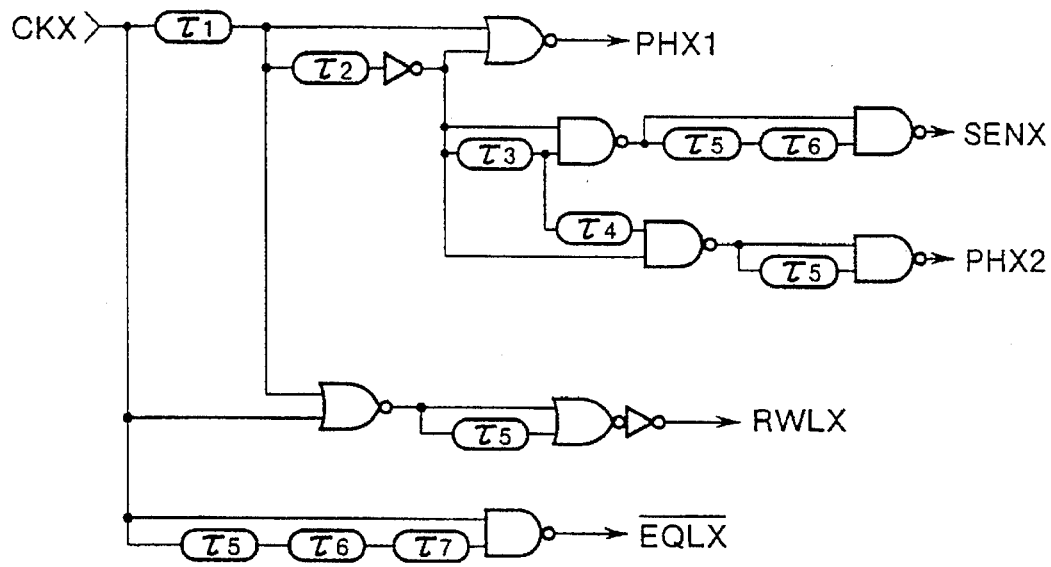
F I G. 6A
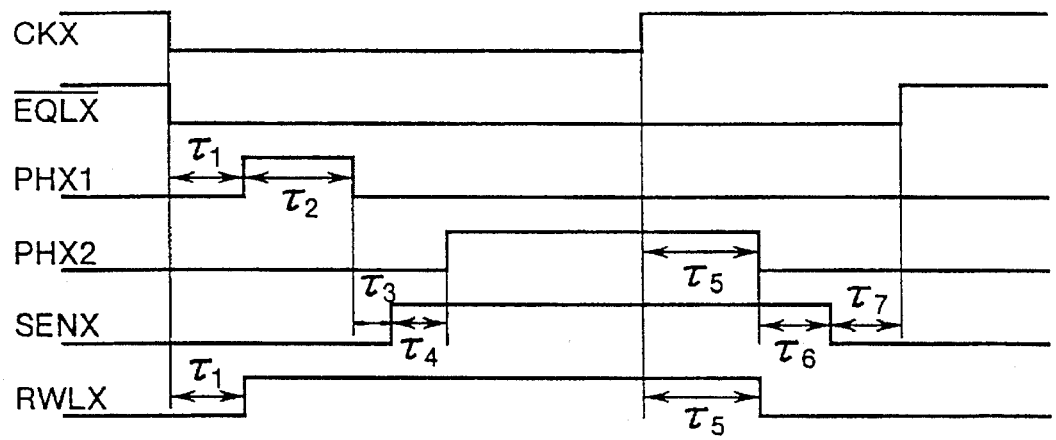
F I G. 6B
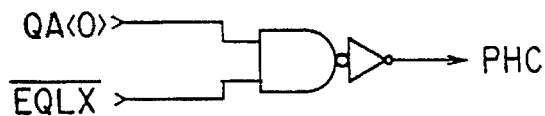
F I G. 6C

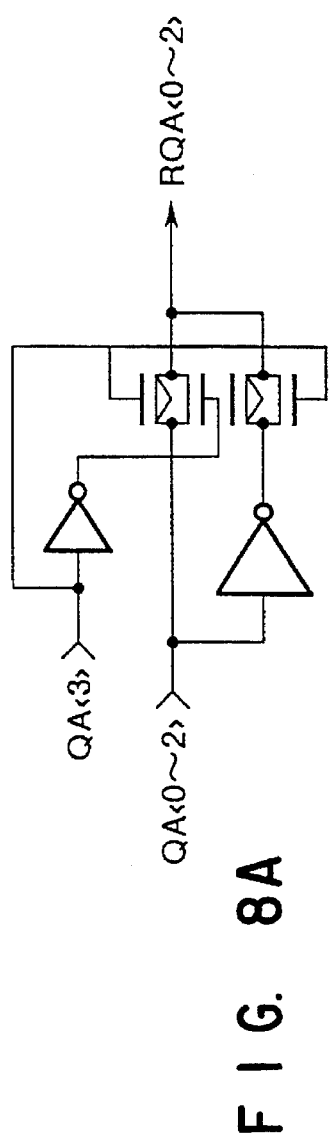
F I G. 8A
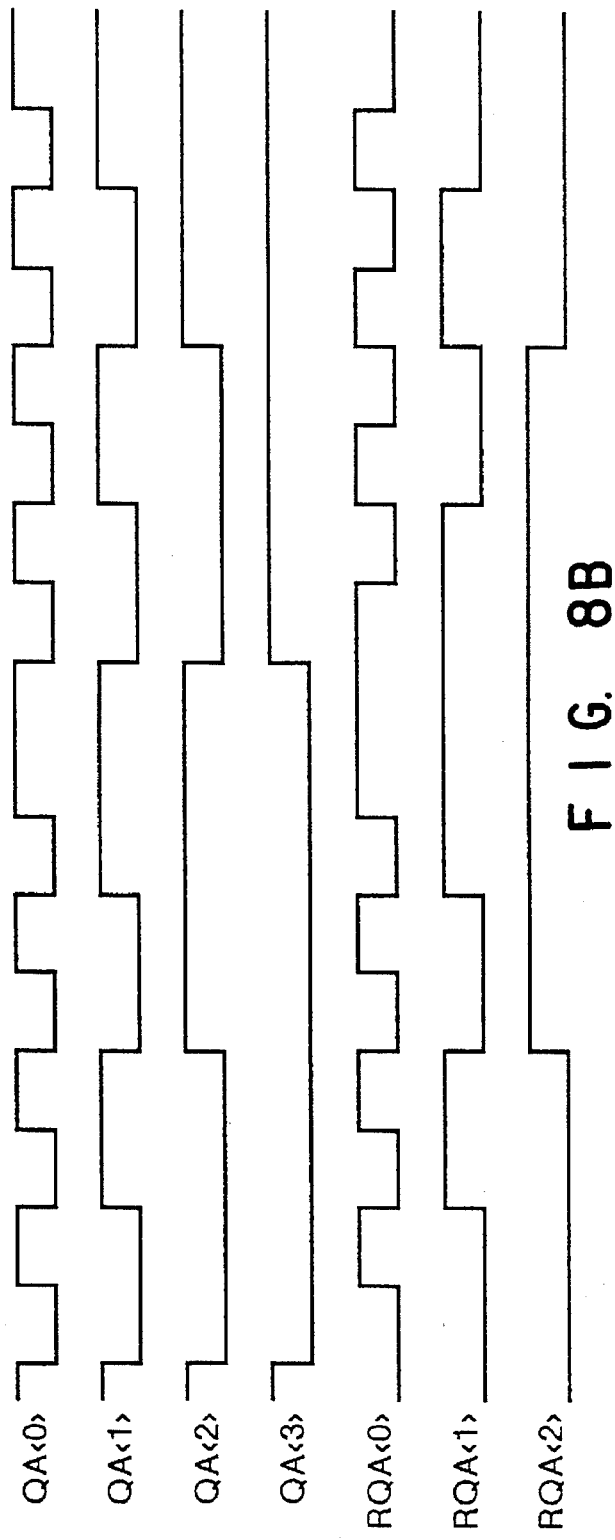
F I G. 8B

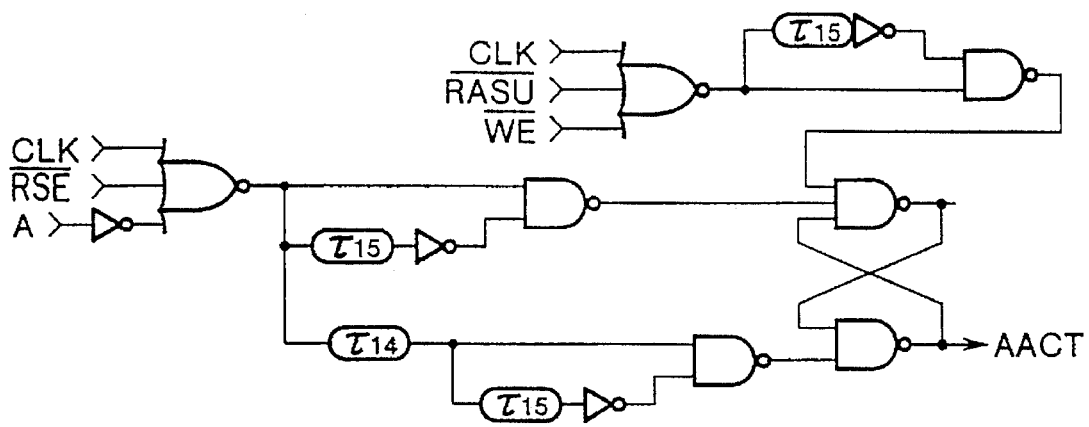
F I G. 9A
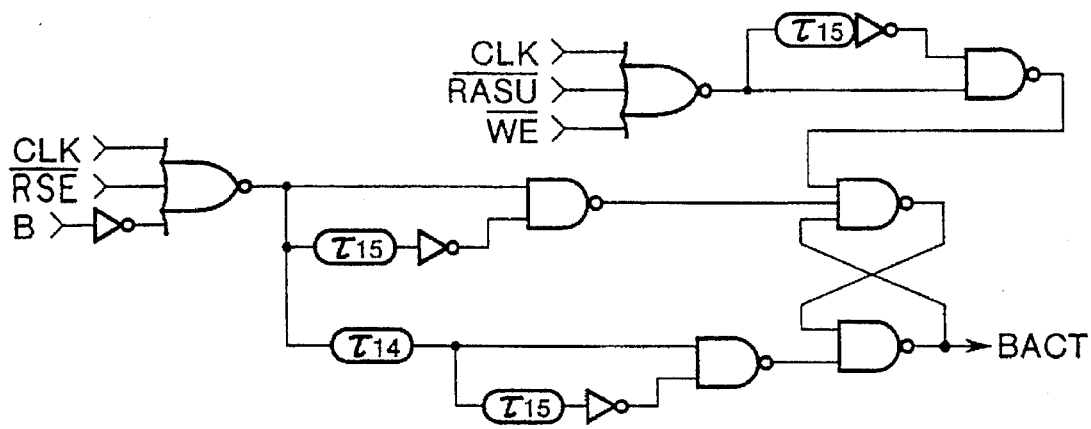
F I G. 9B
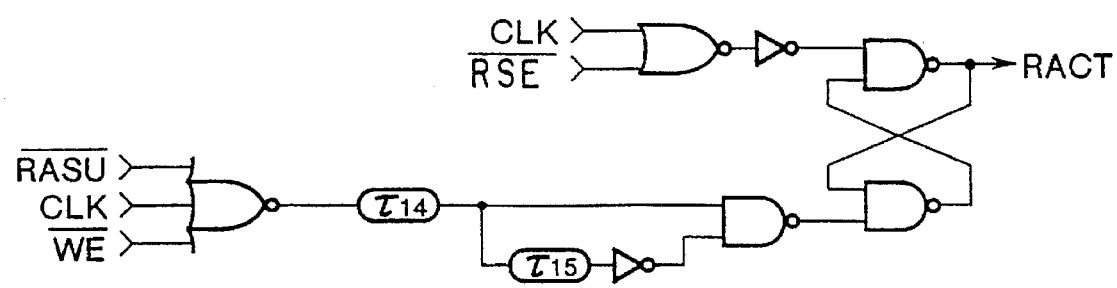
F I G. 9C

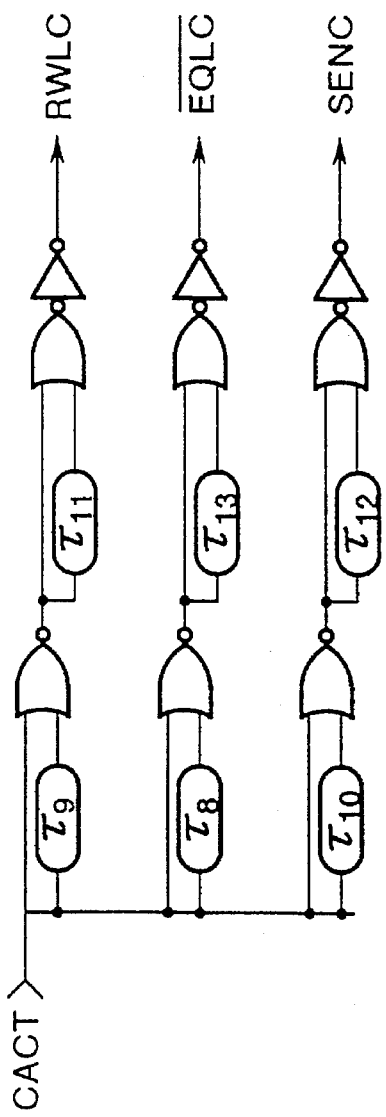
F I G. 11A
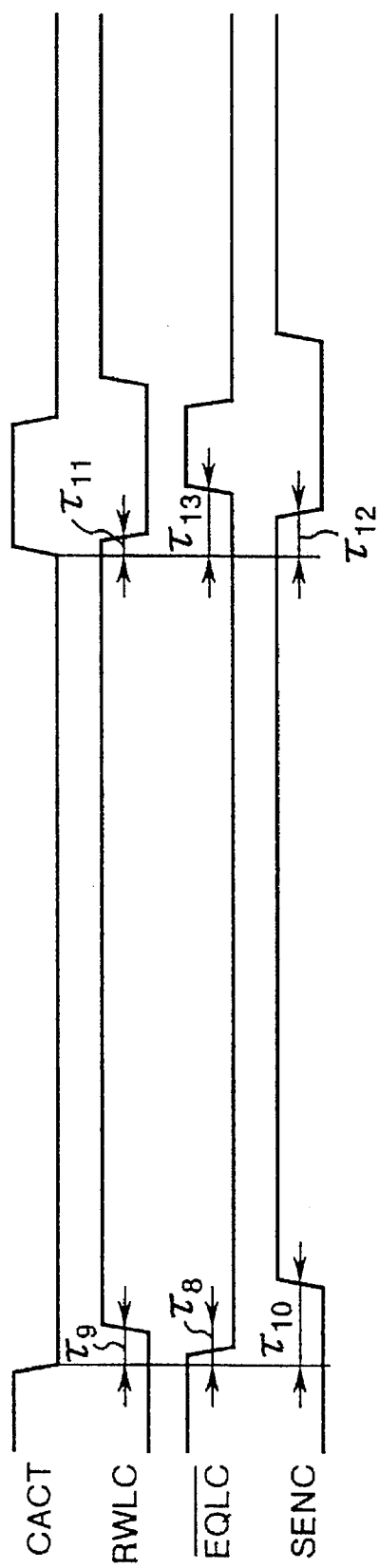
F I G. 11B

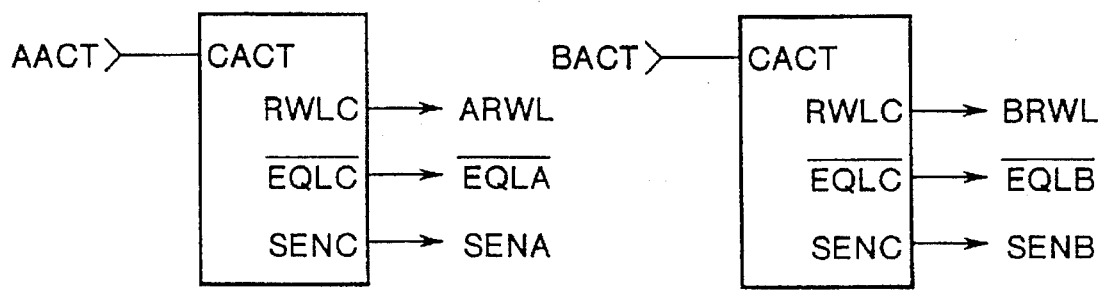
F I G. 12A      F I G. 12B
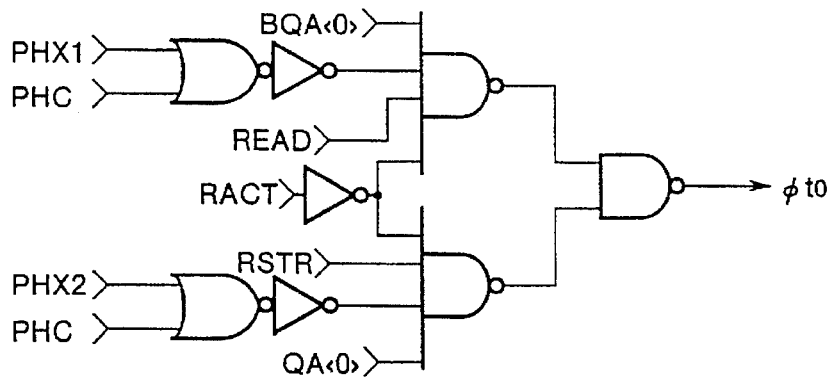
F I G. 13A
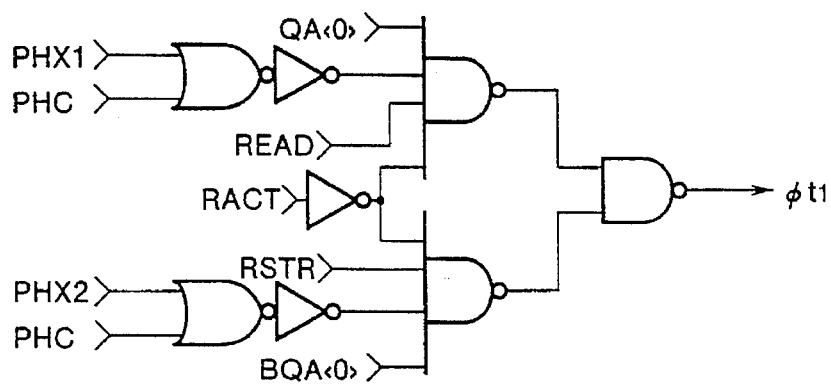
F I G. 13B

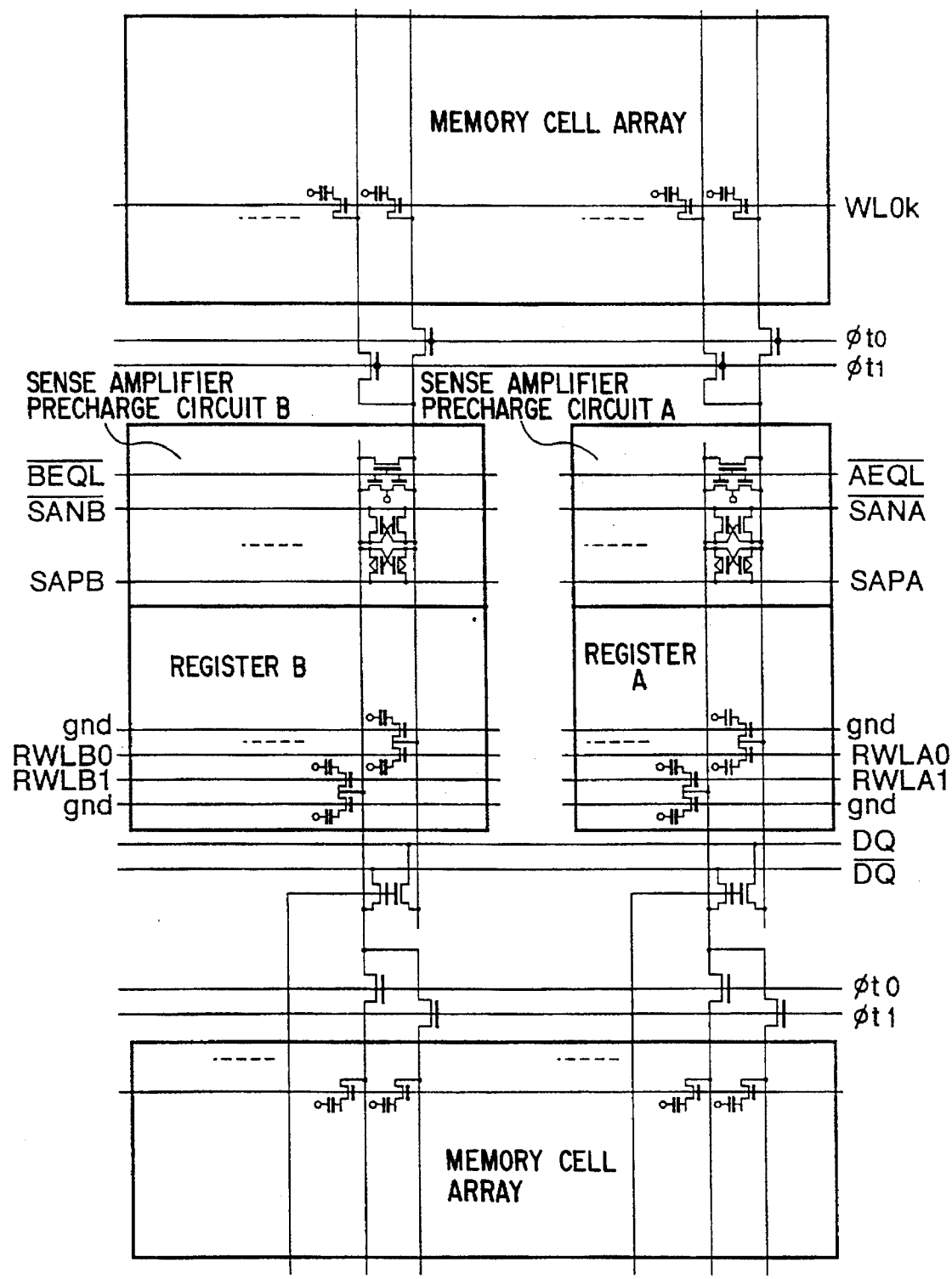
F I G. 17

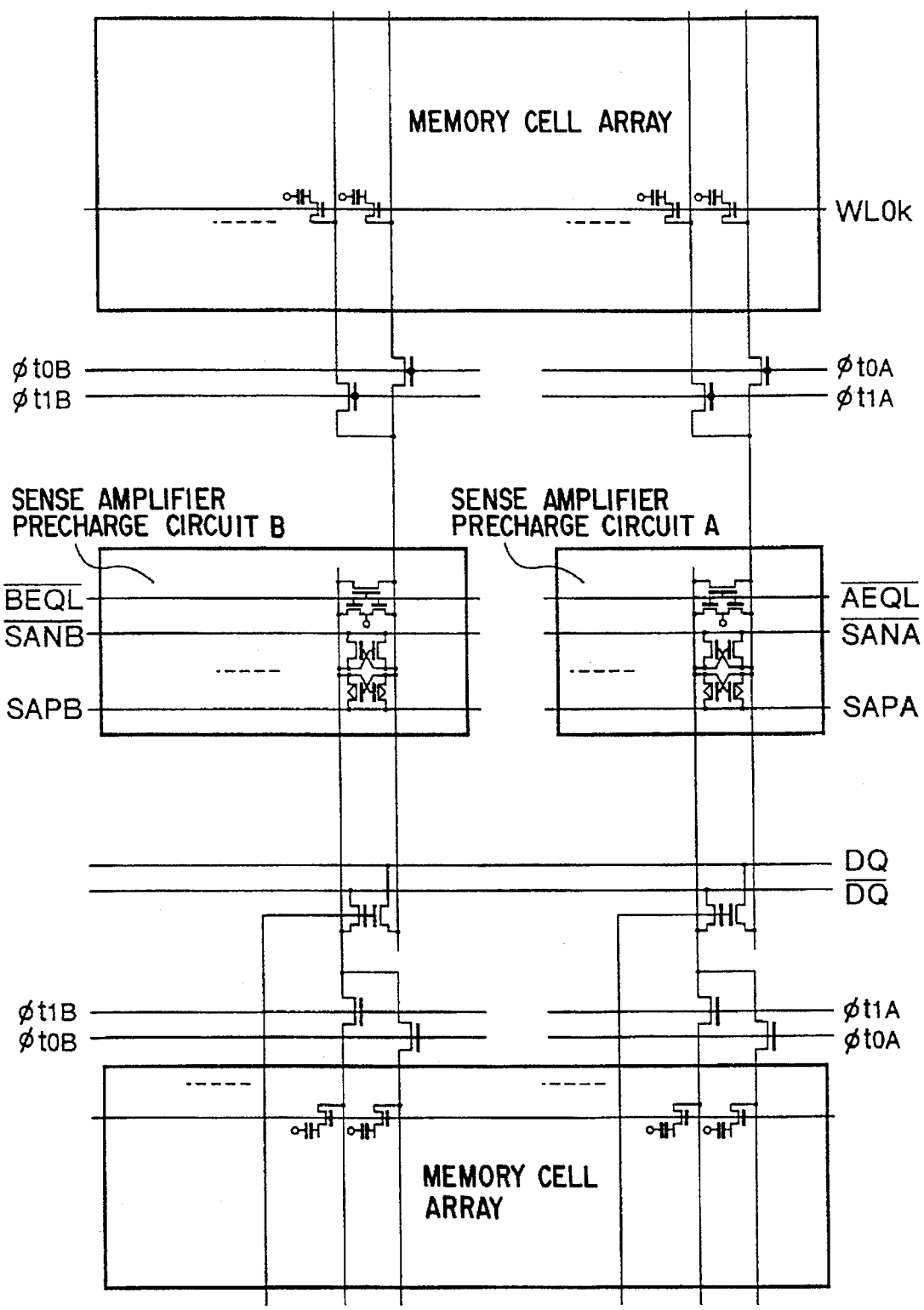
F I G. 18

SEMICONDUCTOR MEMORY DEVICE WITH REDUCED READ TIME AND POWER CONSUMPTION

BACKGROUND OF THE INVENTION

1. Field of the Invention

The present invention relates to a semiconductor memory device and, more particularly, to a semiconductor memory device in which data read performance of a memory cell is improved.

2. Description of the Related Art

To realize a high integration and a large capacity of memory cells, the following semiconductor memory devices are proposed ((1) 1991, IEEE ISSCC DIGEST OF TECHNICAL PAPERS vol. 34, p. 106, TAM6.2, (2) 1993, IEEE ISSCC DIGEST OF TECHNICAL PAPERS vol. 36, p. 46, WP3.31). The semiconductor memory devices are constructed by arranging a plurality of memory cell units, each of which has a plurality of dynamic random access memory cells which are connected in series, in an array and one end of the memory cell unit is connected to the bit line. This device is effective in improving the degree of integration, since the number of bit line contacts can be decreased in accordance with the number of series-connected memory cells.

Devices of this sort, however, have the following problems.

Since memory cells are connected in series, it is necessary to read out data from a memory cell unit sequentially from a memory cell closest to a bit line contact and to write data from a memory cell farthest from the bit line contact. Accordingly, read and rewrite actions take a long time.

Also, a current tendency is to require a page read operation which sequentially reads out consecutive column addresses. Unfortunately, in conventional devices the capacity of pages capable of being successively read out is small. Additionally, when the operation proceeds on to each subsequent page after reading out one page, it is necessary to activate memory cells and perform data detection and amplification using a sense amplifier, resulting in a long operation time. These disadvantages apply not only to devices having a memory cell unit in which a plurality of memory cells are connected in series but also to devices in which memory cells are connected to bit lines, a plurality of sense amplifiers are shared by a plurality of bit lines, and data on the bit lines are time-divisionally read out.

As described above, reads and writes take a long time in conventional semiconductor memory devices, particularly in semiconductor memory devices having a memory cell unit in which a plurality of memory cells are connected in series.

SUMMARY OF THE INVENTION

It is an object of the present invention to provide a semiconductor memory device capable of reducing read out time compared to a conventional memory device while also reducing power consumption, thereby as if the page length can be increased.

It is another object of the present invention to provide a semiconductor memory device capable of reducing read out time compared to a conventional memory device even if the memory cells do not constitute a memory cell unit, while also reducing power consumption, thereby as if the page length can be increased.

To achieve the above objects, the present invention adopts the following arrangement.

A semiconductor memory device according to the first aspect of the invention is characterized by comprising: a memory array in which word lines are driven by a single decoder or a plurality of memory arrays driven by a plurality of decoders operating with the same row address, in the memory array or memory arrays, memory cell units in which a plurality of memory cells are connected in series being arranged in a matrix form; a plurality of sense amplifier arrays constituted by arranging a plurality of sense amplifiers each provided for a pair of bit lines or a plurality of pairs of bit lines to read out data from the memory cells of the memory cell arrays, the sense amplifier arrays being divided into a plurality of blocks, and the blocks corresponding to one memory cell array driven by the single decoder or a plurality of memory cell array driven by a plurality of decoders operating with the same row address; a register array having a plurality of registers for storing data read out by the plurality of sense amplifiers, the register array being divided into a plurality of blocks, and the blocks corresponding to the sense amplifier block and one memory cell array driven by the single decoder or a plurality of memory cell array driven by a plurality of decoders operating with the same row address; and a control circuit for independently controlling the blocks of the sense amplifier arrays and the register array and independently reading out data from the registers in the blocks.

Preferred modes of the present invention are as follows.

(1) The register includes means for temporarily storing readout data from the memory cell unit, and the control circuit includes means for reading out data from the register to an external device without returning the data to the memory cell unit.

(2) Input means for inputting an address for selecting a register to each of the blocks, in addition to a row address and a column address is further provided.

(3) A register is connected to the data read terminal of a sense amplifier.

(4) A device has a switching element for selectively connecting a bit line of a memory array, in which memory cell units are arranged in the form of an array, to a sense amplifier.

(5) A memory cell and a register are constituted by a dynamic memory cell.

According to the first aspect of the present invention, the sense amplifier array and the register array are divided into a plurality of blocks, and a function of making these blocks perform read operations independently of each other is provided. Accordingly, data in one memory cell unit can be successively read out without being returned to the memory cell unit by making the blocks alternately perform the read operation. Consequently, it is possible to increase the effective page length and avoid wasting time and power consumption during read and rewrite actions.

The present invention differs from a conventional bank configuration in the following respects, and, as a result, an increase in the chip area can be avoided.

When a conventional bank arrangement is applied to a NAND DRAM, memory cell arrays in individual banks operate independently of each other. Therefore, a word line control circuit, a row address latch circuit, a row address decoder circuit, and a transfer gate control circuit are necessary for each bank, and this increases the chip area. In contrast, the present invention includes one NAND cell word line control circuit, one address latch circuit, one row address decoder circuit, and one transfer gate control circuit. Accordingly, compared to the conventional bank configuration, the number of control circuits and the corresponding increase in chip area is small. The present invention can also be combined with the conventional bank system.

As described above, according to a first aspect of the present invention it is possible by alternately operating the blocks to successively read out data without returning the data to a memory cell unit. This makes it possible to avoid wasting time and power consumption during read and rewrite actions. In particular, the page length can be increased in a page read.

A semiconductor memory device according to a second aspect of the invention is characterized by comprising: a memory array in which word lines are driven by a single decoder or a plurality of memory arrays driven by a plurality of decoders operating with the same row address, the memory array or memory arrays having memory cells provided at intersections of a plurality of bit lines and a plurality of word lines; a sense amplifier array having sense amplifiers each provided for a plurality of pairs of bit lines to read out data from the memory cells, the sense amplifier array being divided into a plurality of blocks, and the blocks corresponding to one memory cell array driven by the single decoder or a plurality of memory cell array driven by a plurality of decoders operating with the same row address; a switch array having switching elements each provided between a pair of bit lines and a sense amplifier corresponding to the pair of bit lines to connect a pair of bit lines to each sense amplifier, the switch array being divided into a plurality of blocks, and the blocks corresponding to one memory cell array driven by the single decoder or a plurality of memory cell array driven by a plurality of decoders operating with the same row address; and a control circuit for independently controlling the blocks of the sense amplifier array and the switch array and independently reading out data from the blocks.

According to the second aspect of the present invention, the switch array and the sense amplifier array are divided into a plurality of blocks, and these blocks are made to operate independently of each other. Therefore, data read out into a sense amplifier can be temporarily stored in a bit line. While data is being read out from one sense amplifier block to an external device, data temporarily stored in a bit line corresponding to the other sense amplifier block is again read out into a sense amplifier. Consequently, data can be successively read out each time the blocks are switched.

Another semiconductor memory device according to the second aspect of the invention is characterized by comprising: a memory array in which word lines are driven by a single decoder or a plurality of memory arrays driven by a plurality of decoders operating with the same row address, the memory array or memory arrays having memory cells provided at intersections of a plurality of bit lines and a plurality of word lines; a sense amplifier array having sense amplifiers each provided for a plurality of pairs of bit lines to read out data from the memory cells, the sense amplifier array being divided into a plurality of blocks, and the blocks corresponding to one memory cell array; a switch array having switching elements each provided between a pair of bit lines and a sense amplifier corresponding to the pair of bit lines to connect a pair of bit lines to each sense amplifier; a register array having registers for storing data read out by the sense amplifiers, the register array being divided into a plurality of blocks, and the blocks corresponding to one memory cell array driven by the single decoder or a plurality of memory cell array driven by a plurality of decoders operating with the same row address; and a control circuit for independently controlling the blocks of the sense amplifier arrays and the register array and independently reading out data from the registers in the blocks.

According to another device of the second aspect of the present invention, one sense amplifier is shared by a plurality of pairs of bit lines. Therefore, as when a memory cell unit is used, a plurality of data can be temporarily stored in a register with respect to one sense amplifier. As in the device of the first aspect, data can be successively read out without being returned to a memory cell by alternately operating the blocks. Accordingly, the effective page length can be increased.

As described above, in the second aspect of the present invention, as in the first aspect, by alternately operating the blocks it is possible to successively read out data without returning the data to a memory cell and thereby increase the effective page length.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a block diagram showing a schematic arrangement of a semiconductor memory device according to the first embodiment;

FIG. 4 is a timing chart showing the timings of NAND cell control signals;

FIGS. 5A to 5C are views showing circuits for generating NAND cell control signals and the truth table of the circuits;

FIGS. 6A to 6C are views showing a circuit for generating NAND cell control signals and the operation timings of the circuit;

FIGS. 8A and 8B are views showing a circuit for generating NAND cell control signals and the operation timings of the circuit;

FIGS. 9A to 9C are views showing control circuits (register cell timing generating circuits) for reading out data from a register to an external device;

FIGS. 11A and 11B are views showing a control circuit (register cell timing generating circuit) for reading out data from a register to an external device;

FIGS. 12A and 12B are views showing operation control circuits for A and B register cells, respectively;

FIGS. 13A and 13B are circuit diagrams showing transfer gate control circuits for individual blocks;

FIG. 17 is a circuit diagram showing details of memory arrays, sense amplifiers, and registers in the second embodiment;

FIG. 18 is a circuit diagram showing details of memory arrays, sense amplifiers, and registers in the third embodiment;

DETAILED DESCRIPTION OF THE PREFERRED EMBODIMENTS

Figure 2:
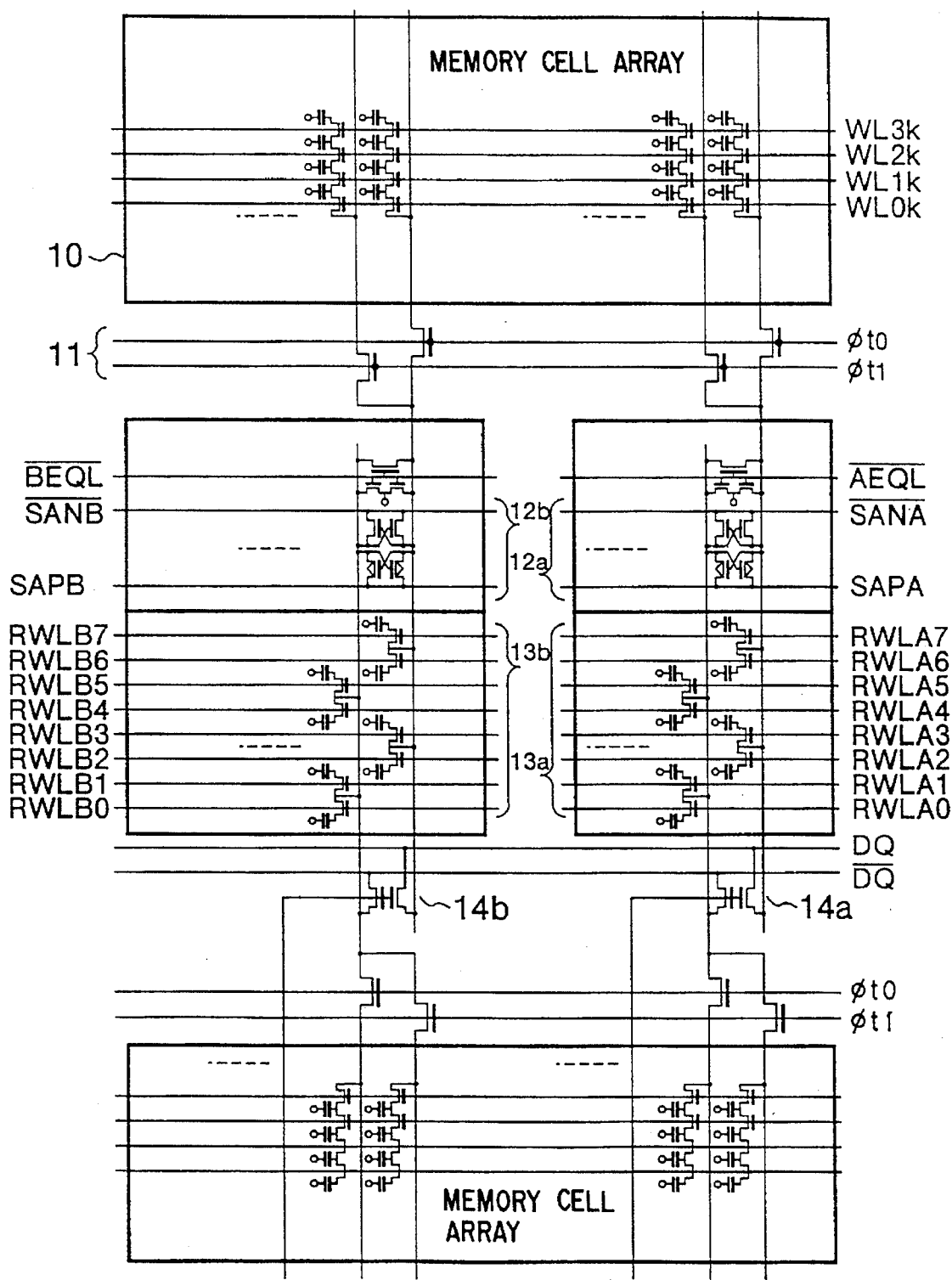
FIG. 2 is a circuit diagram showing details of memory arrays, sense amplifiers, and registers in the first embodiment.

Preferred embodiments of the present invention will be described in detail below with reference to the accompanying drawings.

(First Embodiment)

FIG. 1 is a block diagram showing a schematic arrangement of a semiconductor memory device according to the first embodiment of the present invention. An array (NAND cell array) 10 of memory cell units (to be referred to as NAND cells hereinafter) in which a plurality of memory cells (e.g., DRAM cells) are connected in series is provided with sense amplifier arrays 12, register arrays 13, and precharge circuit arrays (not shown) via a transfer gate array 11. The arrays 12 and 13 and the precharge circuit arrays are divided into two blocks A and B, and each block includes a sense amplifier driver 22, a register WL driver 23, and an equalizer driver (not shown). These drivers are controlled by a signal from a NAND cell control circuit 20 and a control signal generated when a register cell is accessed from an external device.

In the semiconductor memory device of this embodiment, the sense amplifier arrays 12, the register arrays 13, and the precharge circuit arrays have two operation modes: in one these arrays operate in synchronism with read and write actions to NAND cells; in the other these arrays independently operate in the individual blocks (A and B) when data read out into the register arrays 13 are read out to an external device by externally selecting the respective register arrays 13.

FIG. 1 also illustrates DQ gates 14, a row decoder 15, a transfer gate control circuit 21, column decoders 24, register cell control circuits 32, register address buffers 33, address buffers/counters 34, a row address buffer 35, and a register cell timing generating circuit 36.

FIG. 2 is a circuit diagram showing details of the NAND cell array 10, the sense amplifier arrays 12, and the register arrays 13.

In this embodiment, one sense amplifier is time-divisionally shared by a pair of bit lines. However, it is unnecessary to time-divisionally share one sense amplifier. Alternatively, one sense amplifier can be shared by another number of bit lines, e.g., four or eight bit lines. Also, in this embodiment all the word lines (WL0k to WL3k) of the NAND cells in the memory array 10 are connected together. However, these word lines need not be connected as long as they are simultaneously activated with respect to an input address. That is, separate row decoders also can be used.

With respect to the memory array 10 with the above arrangement, the sense amplifier arrays 12, the equalizer circuit arrays, and the register arrays 13 are divided into two blocks (A and B), and these blocks independently operate with respect to an access to the register arrays 13 from an external device.

Figure 3A:
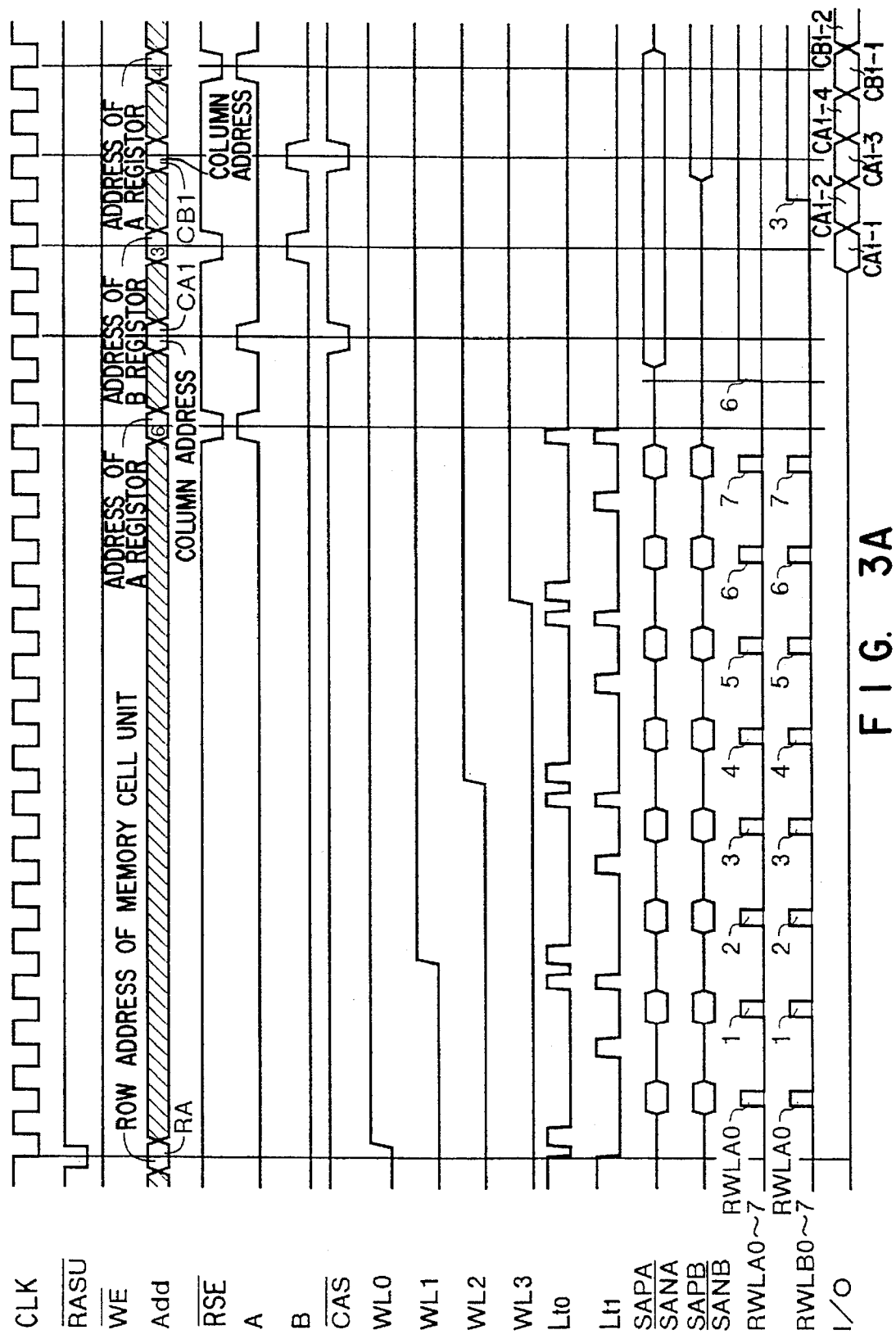
FIGS. 3A and 3B are timing charts showing the operation timings in the first embodiment.
Figure 3B:
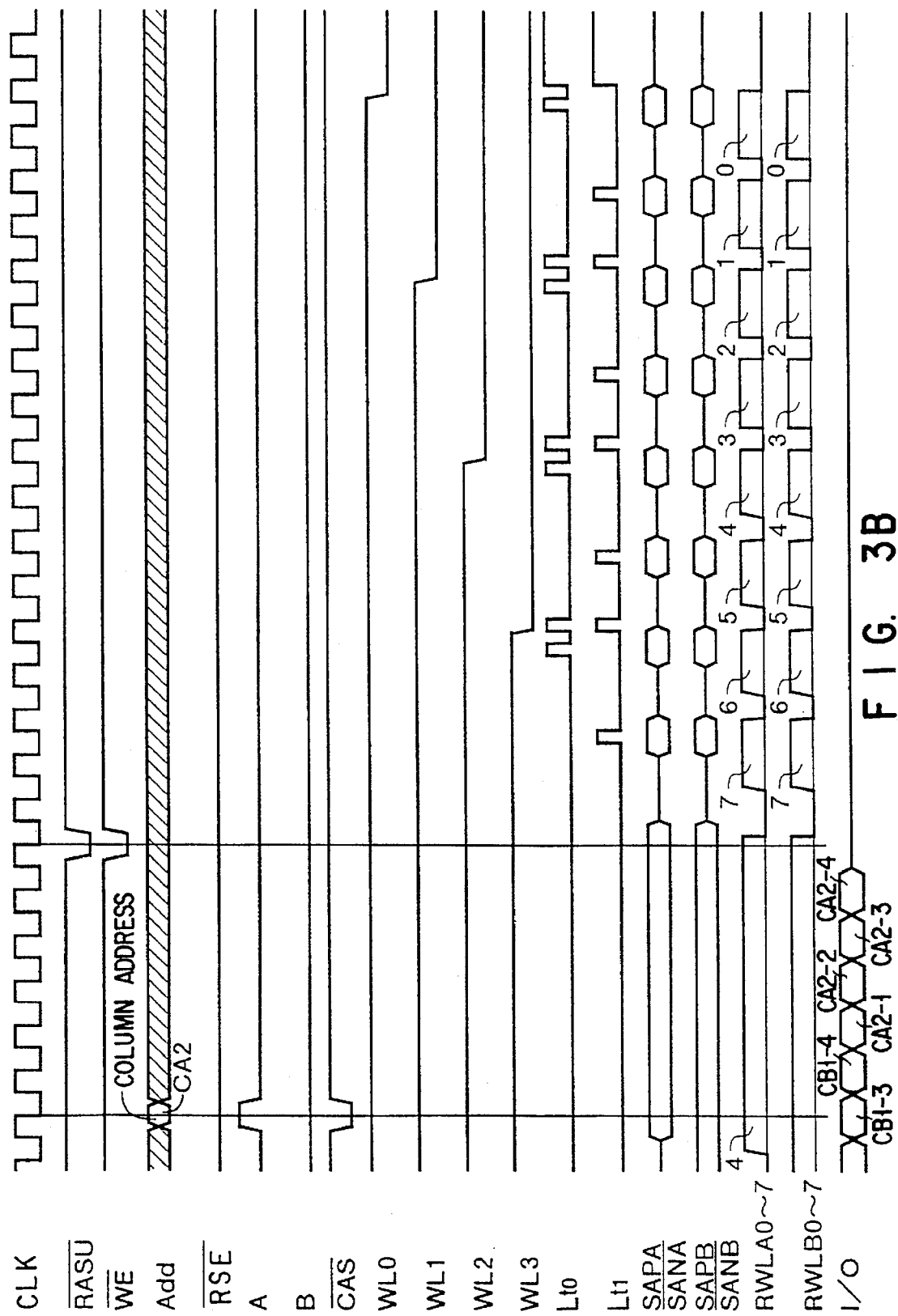

FIGS. 3A and 3B are timing charts showing the operation timings in this embodiment. This embodiment is so designed as to output data in synchronism with a clock CLK. However, this is not particularly essential to the present invention, so it is also possible to use a method in which an output is not synchronized with the clock CLK.

External signals used in this embodiment, in addition to the clock CLK, are a signal /RASU for strobing an address of a NAND cell, a write enable signal /WE, an address input terminal Add, a signal/RSE for strobing an address of a register, block select signals A and B, and a signal /CAS for strobing a column address.

As shown in FIG. 3A, when the signal /RASU is input, in a NAND cell selected by the address, data are sequentially read out from (memory) cells from the one closest to a bit line by sequentially putting WLs to "H". After all data of the NAND cell are transferred to a register cell, address 6 of a register cell in the A block is input by the signals /RSE and A and latched by a sense amplifier. After two clocks, a column address to be read out in the A block is input by the signals /CAS and A and a column address CA1. After another two clocks, four data (CA1-1, CA1-2, CA1-3, and CA1-4) are successively read out from the input column address to an external device.

In this embodiment, a delay (latency) from the input of a register cell address to the input of a column address is two clocks, a delay (latency) from the column address input to the output of data is two clocks, and the number (burst length) of data to be successively read out is four. However, the numbers of clocks and data are not limited to these numbers. For example, the delay (latency) from the register cell address input to the column address input can be three clocks, and the delay (latency) from the column address input to the data output can be three clocks.

While the data in the A block is being read out to the external device, address 3 of a register cell in the B block is selected by the signals /RSE and B and latched by a sense amplifier. After two clocks, a column address to be read out in the B block is input by the signals /CAS and B and a column address CB1. After another two clocks, following the last data CA1-4 of the A block four data (CB1-1, CB1-2, CB1-3, and CB1-4) are successively output from the input column address to the external device.

As described above, to read out data in the B block subsequently to data in the A block, it is necessary to input an address of a register cell in the B block at least four clocks (the two-clock delay (latency) from the register cell address input to the column address input plus the two-clock delay (latency) from the column address input to the data output) before the last data of the A block is output, and to input a column address two clocks before that. With this operation, the data in the B block can be read out subsequently to the data in the A block.

Furthermore, while the data in the B block is being read out, address 4 of the register cell in the A block is input, and, as illustrated in FIG. 3B, a column address CA2 is input. Consequently, data (CA2-1, CA2-2, CA2-3, and CA2-4) can be read out from address 4 of the register cell in the A block subsequently to the data in the B block.

When a desired operation of reading out data to the external device is completed, the signals /WE and /RSE are input to perform a rewrite action from the register cell to the NAND cell in a reverse order of the initial order of reads from the NAND cell to the register cell.

As described above, the sense amplifier arrays 12, the equalizer circuit arrays, and the register cell arrays 13 are divided into two blocks (A and B), and the divided arrays in the two blocks are allowed to operate independently of each other. Consequently, all data of a NAND cell read out into a register cell can be successively read out to an external device. This increases the data amount (page length) capable of being successively read out to an external device. Unlike the present invention, in conventional devices a sense amplifier array and the like array are not divided. To read out data from different register cells, therefore, it is necessary to write data currently held in a sense amplifier back into a corresponding register cell and read out data from another register cell. This results in a waiting time being necessarily inserted. Accordingly, the data amount (page length) capable of being successively read out to an external device equals the number of sense amplifiers.

Consider, for example, a case in which a NAND DRAM is used as an image data memory. Assume that displaying image data requires 760 pixels on one scan line and 8-bit data at each pixel. To successively read out data from one scan line in this arrangement, conventional methods require 5760 (720×8) sense amplifiers. In the method of this embodiment, however, each register cell has eight bits for one sense amplifier, and these bits can be successively read out to an external device. Accordingly, the number of sense amplifiers required is 720 (5760/8), resulting in a decreased number of sense amplifiers being necessary to read out one page. This leads to a decrease in the chip area and consequently to a low cost.

When a conventional bank configuration is applied to a NAND DRAM, memory cell arrays in individual banks operate independently of each other. Therefore, a word line control circuit (reference numeral 20 in FIG. 1), a row address latch circuit (reference numeral 35 in FIG. 1), a row address decoder circuit (reference numeral 15 in FIG. 1), and a transfer gate control circuit (reference numeral 21 in FIG. 1) are necessary for each bank, and this increases the chip area. In contrast, the present invention includes one NAND cell word line control circuit (reference numeral 20 in FIG. 1), one address latch circuit (reference numeral 35 in FIG. 1), one row address decoder circuit (reference numeral 15 in FIG. 1), and one transfer gate control circuit (reference numeral 21 in FIG. 1). Accordingly, compared to the conventional bank configuration, the number of control circuits and the corresponding increase in chip area is small. The present invention can also be combined with the conventional bank system.

FIGS. 4 to 8B are views showing detailed circuits of the NAND cell control circuit 20 for generating NAND cell control signals and the operation timings of these circuits.

FIG. 4 is a timing chart showing data read and write actions to a NAND cell. FIGS. 5A to 5C are views showing circuits for generating word line timings (WDRV0 to WDRV3) from an internal clock CKX and the truth table of the circuits. CKX is a timing signal for transferring 1-bit data per period from a NAND cell to a register cell or vice versa. The word line timings of a NAND cell are generated by using an output from a 4-bit binary counter.

FIG. 6A shows a circuit for generating the timings of a transfer gate, a sense amplifier operation, a register cell operation, and a bit-line-pair equalizer operation from the internal clock CKX when one-bit data is transferred. FIG. 6B is a timing chart of the circuit. A signal PHX1 is a transfer gate (reference numeral 11 in FIG. 1) control signal used when data is transferred from a NAND cell to a register cell. A signal PHX2 is used to control the word line of a register cell when data is transferred from a NAND cell to the register cell and to control a transfer gate when data is transferred from a register cell to a NAND cell. A signal SENX is a sense operation control signal. A signal RWLX is used to control the operation of the word line of a register cell when data is transferred from the register cell to a NAND cell. A signal /EQLX is used to control the equalizer operation of a bit line pair. FIG. 6C is a circuit diagram of a circuit for generating a signal PCH which defines a timing (shown in FIG. 4) at which a transfer gate for equalizing a bit line pair of a cell array unit at every two periods of CKX is enabled, in accordance with and an output signal QA<0> of the counter, FIG. 4.

Figure 7A:
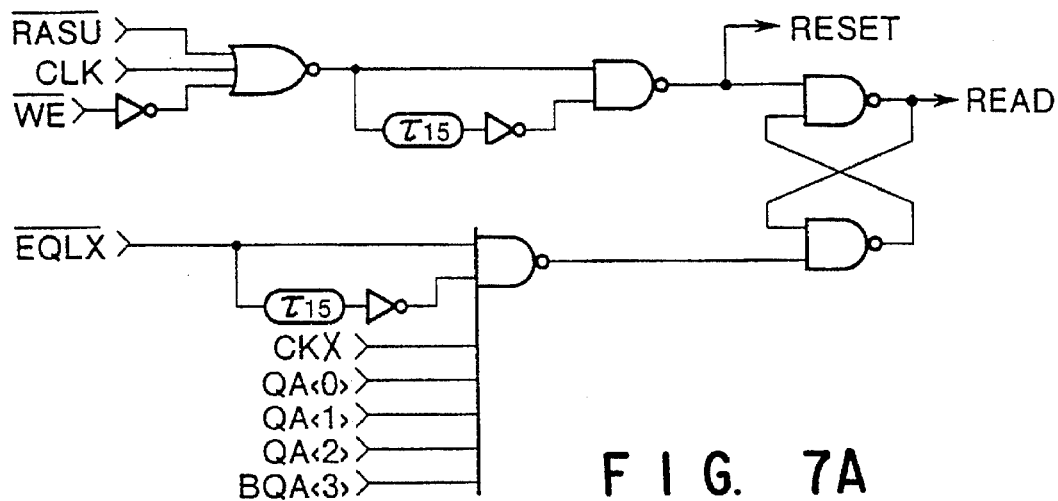
FIGS. 7A to 7C are views showing circuits for generating NAND cell control signals.
Figure 7B:
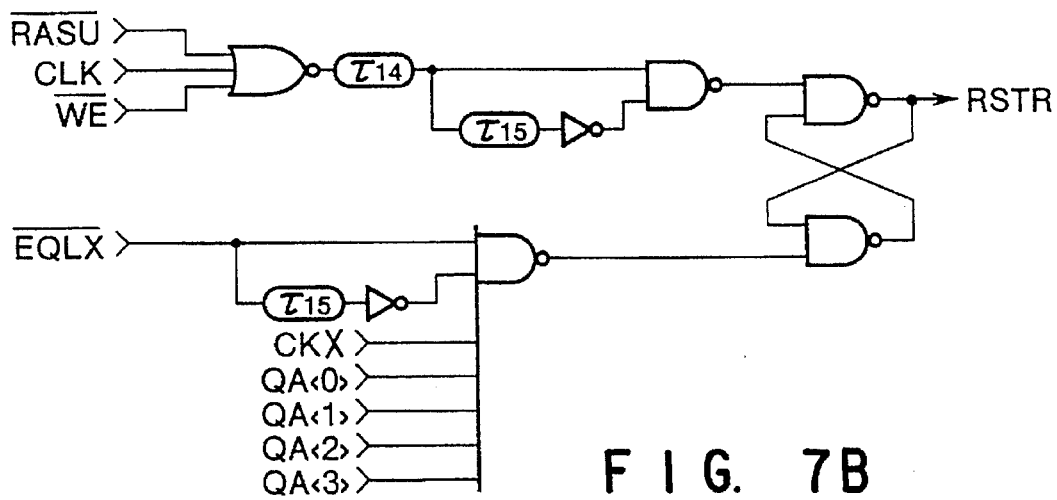
Figure 7C:
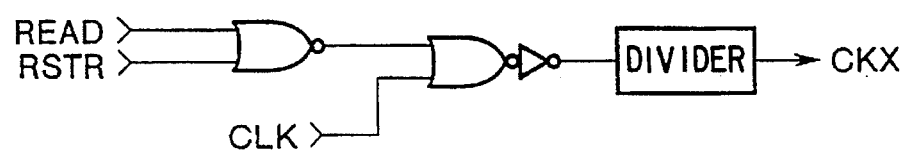
Figure 10:
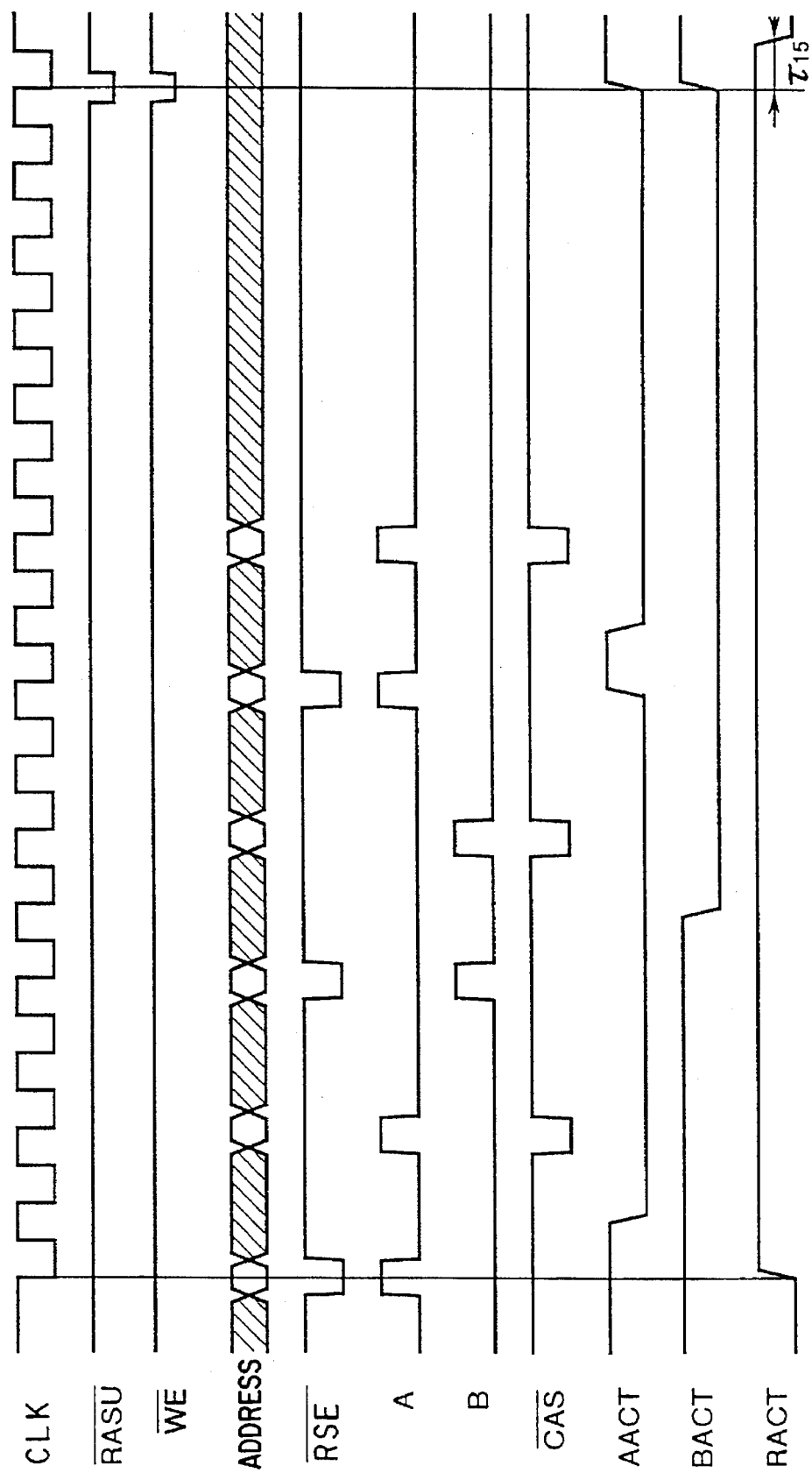
FIG. 10 is a timing chart showing the timings at which data is read out from a register to an external device.

FIG. 7A illustrates a circuit for generating a signal READ which indicates the period of data transfer from a NAND cell to a register cell. FIG. 7B illustrates a circuit for generating a signal RSTR indicating the period of data transfer from a register cell to a NAND cell. FIG. 7C shows a circuit for generating the internal clock CKX when the signals READ and RSTR are generated, i.e., when data is transferred between a NAND cell and a register cell. CKX is formed by frequency-dividing the external clock CLK. However, CKX need not be formed from the external clock CLK but can be formed using an internal oscillator. When CKX is internally formed, the internal operating speed can be maintained independently of a change in the period of the external clock. The result is the advantage that it is not necessary to alter the access time.

FIGS. 8A and 8B are views showing a circuit for generating signals RQA<0> to RQA<2> for defining the order of operations of register cells from the output signals (QA<0> to QA<3>) of the counter, FIG. 5A, and the operation timings of the circuit, respectively. In the circuit of FIG. 8A, the order of transfer of data from a NAND cell to a register cell is the reverse of the order of transfer of data from a register cell to a NAND cell. Therefore, the order of outputs from the counter when data is transferred from a NAND cell to a register cell is reversed when data is transferred from a register cell to a NAND cell.

FIGS. 9A to 9C and 10 are views showing the control circuit (register cell timing generating circuit) 36 for reading out data from a register cell to an external device and a timing chart of the circuit. FIGS. 9A, 9B, and 9C illustrate circuits for generating AACT, BACT, and RACT, respectively.

An address of a register cell in the A block is fetched by an A block select signal A and an /RSE signal, and the signal AACT for defining a period during which the register cell in the A block is read out is generated. Also, an address of a register cell in the B block is fetched by a B block select signal B and the /RSE signal, and the signal BACT for defining a period during which the register cell in the B block is read out is generated. The signal RACT defines a period during which data in a register cell can be read out to an external device. The signal RACT indicates a time interval from the input timing of the signal /RSE to the input timing of the signals /RASU and /WE.

FIGS. 11A, 11B, 12A, and 12B illustrate the circuit (register cell control circuit) 32 for generating timings for a sense amplifier operation, an equalizer operation, and an operation of the word line of a register cell when data is read out from the register cell to an external device. A basic circuit shown in FIG. 11A forms a timing signal SENC for a sense amplifier operation, a timing signal /EQLC for an equalizer operation, and a timing signal /RWLC for an operation of the word line of a register cell. As illustrated in FIGS. 12A and 12B, identical circuits are arranged in two blocks. FIG. 12A shows a circuit 32a when the circuit illustrated in FIG. 11A is used for the A block. FIG. 12B shows a circuit 32b when the circuit illustrated in FIG. 11A is used for the B block.

FIGS. 13A and 13B are circuit diagrams showing the transfer gate control circuit 21. The transfer gate control circuit 21 generates the operation timings of transfer gate signals $\phi t0$ and $\phi t1$ by using the signals PHX1 and PHX2, FIG. 6A, the counter output signals BQA<0> and QA<0>, FIG. 5A, and the signals READ and RSTR, FIGS. 7A and 7B, respectively, when data is transferred from a NAND cell to a register cell and vice versa. The control circuit 21 uses the signal RACT which defines a period during which data can be read out from a register cell to an external device, and puts $\phi t0$ and $\phi t1$ to "L" to disable the transfer gate during this period in which data is read out from a register cell to an external device.

Figure 14A:
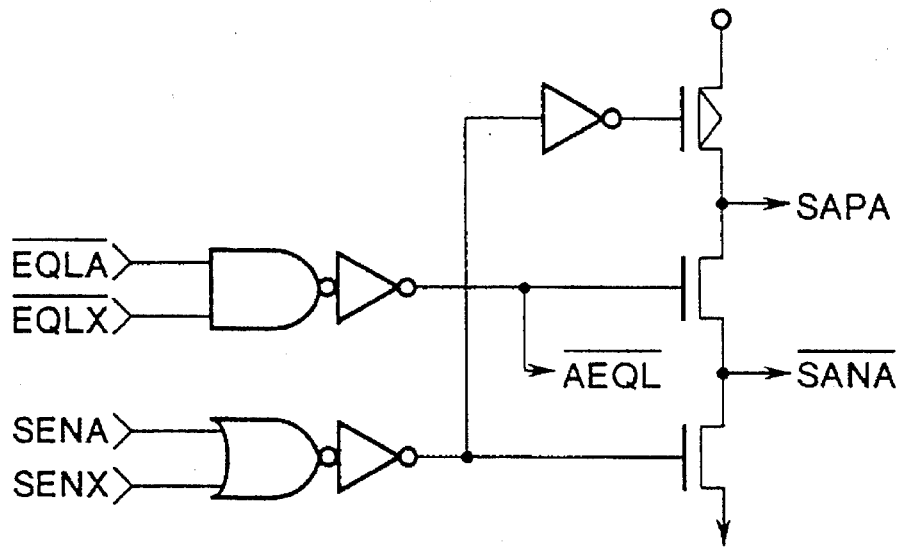
FIGS. 14A and 14B are circuit diagrams showing sense amplifier drivers and equalizer signal generating circuits for individual blocks.
Figure 14B:
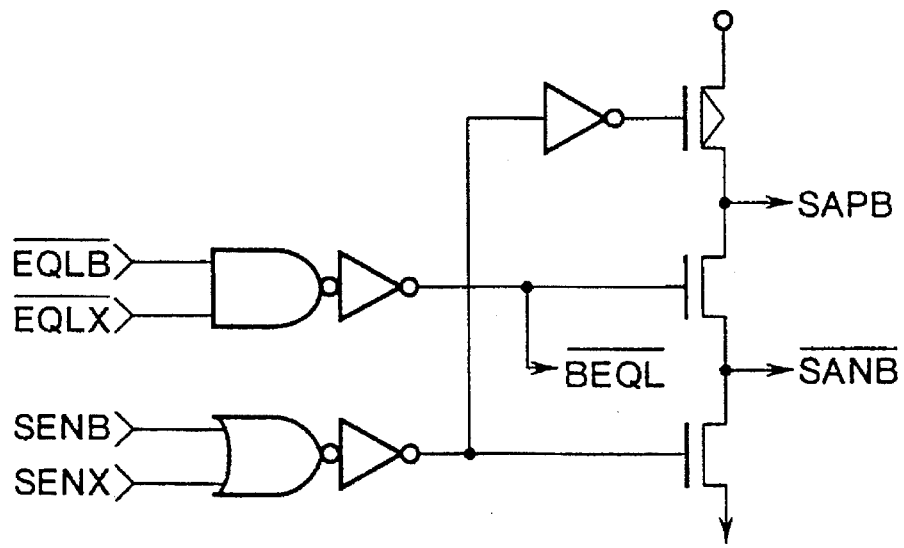

FIGS. 14A and 14B illustrate circuits (sense amplifier drivers) 22a and 22b for driving sense amplifiers in two blocks. These circuits generate timings for sense operation signals /SANA and SAPA and an equalizer signal /AEQL in the A block and sense operation signals /SANB and SAPB and an equalizer signal /BEQL in the B block by using the timing signals /EQLX and SENX, FIG. 6A, when data is transferred between a NAND cell and a register cell, and the timing signals /EQLA, /EQLB, SENA, and SENB, FIGS. 12A and 12B, when data is read out from a register cell to an external device.

Figure 15:
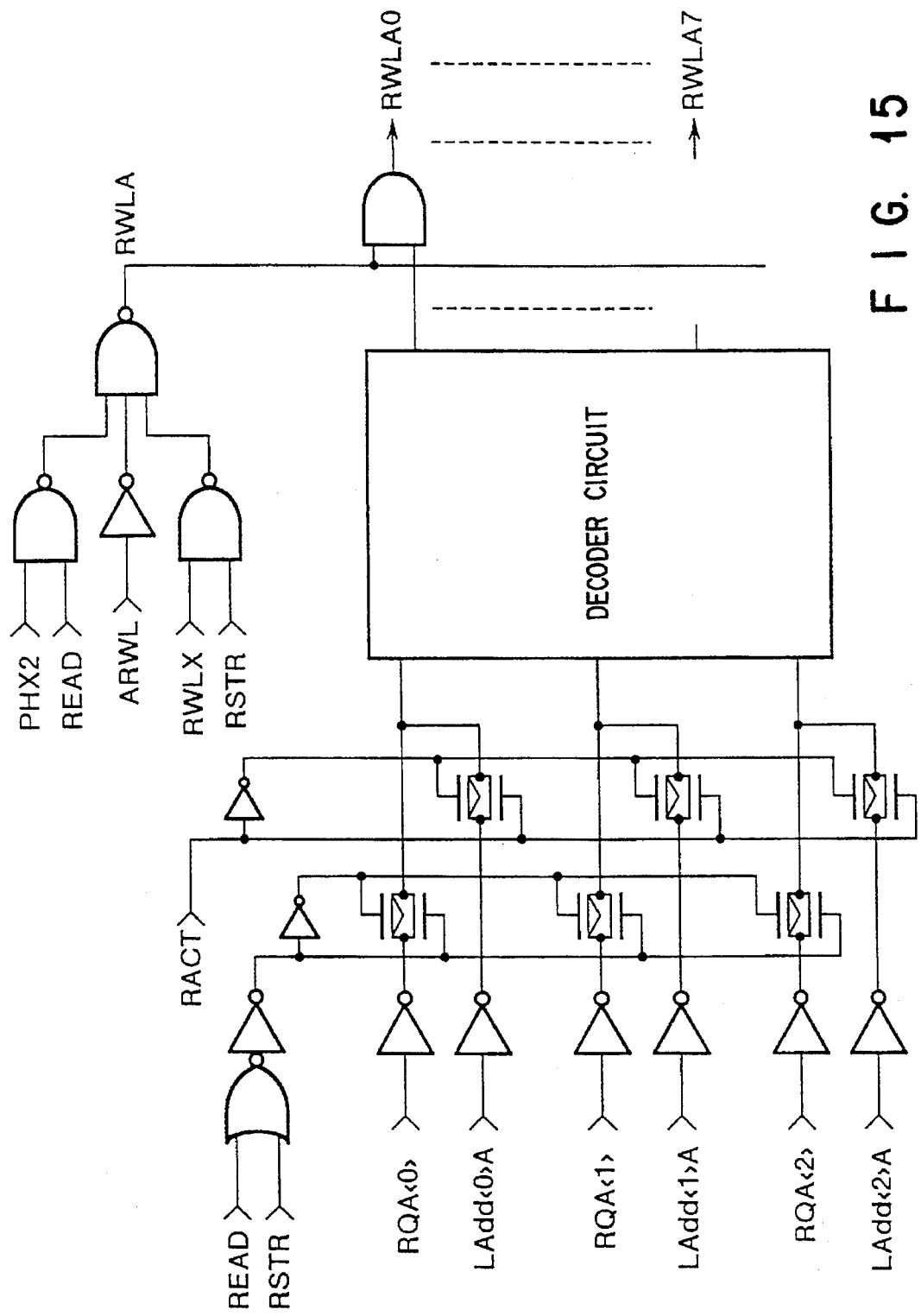
FIG. 15 is a circuit diagram showing a register word line driver in an A block.
Figure 16:
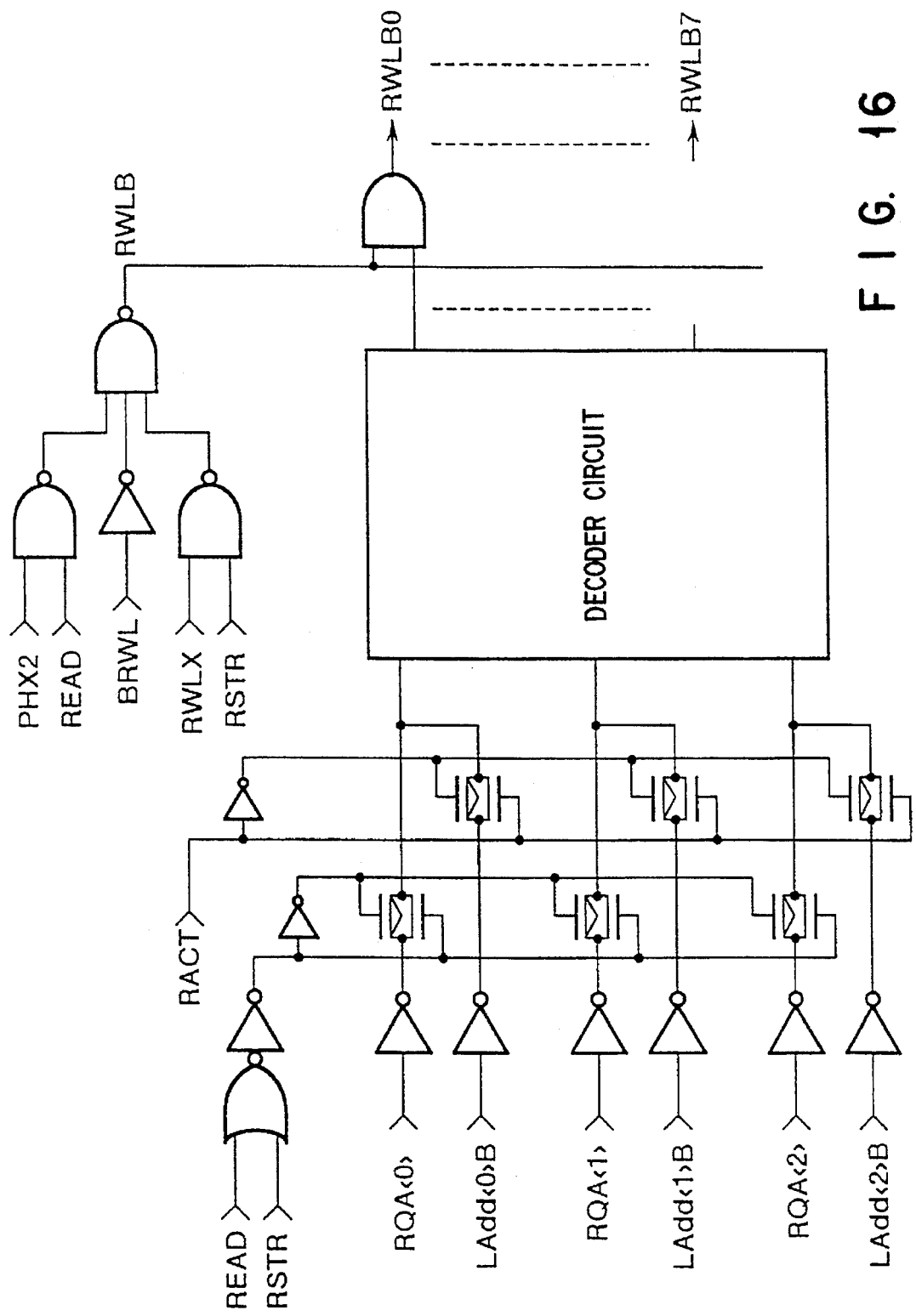
FIG. 16 is a circuit diagram showing a register word line driver in a B block.

FIG. 15 shows a driver (register WL driver) 23a for driving the word lines of register cells in the A block. This driver generates the operation timing of the word line of a register cell when data is transferred between a NAND cell and the register cell by using the signals PHX2 and RWLX, FIG. 6A, and the signals READ and RSTR, FIGS. 7A and 7B, respectively, generates the operation timing of the word line of a register cell when data is read out from the register cell to an external device by using the signal ARWL, FIG. 12A, and generates an operation timing signal RWLA for the word line of a register cell by combining these signals. Selection of a register cell is done by switching inputs by using the signals READ, RSTR, and RACT. When the signals READ and RSTR are activated, the signals RQA<0>, RQA<1>, and RQC<2>, FIGS. 8A and 8B, are input to a decoder circuit. When the signal RACT is activated, register cell address signals LAdd<0>A, LAdd<1>A, and LAdd<2>A are input from an external device to the decoder circuit. In accordance with AND of the signal RWLA and the decode signal, operations of word lines RWLA0 to RWLA7 of a register cell are performed. FIG. 16 shows a B block register WL driver 23b having the same circuit configuration as in FIG. 15. Outputs of the driver 23b are RWLB0 to RWLB7.

In this embodiment, only a read operation is described and a write operation is omitted. However, a write operation can be performed in the same fashion as in conventional devices.

Also, in this embodiment all data in a NAND cell are once read out into a register and then read out from the register to an external device. However, a register can also be accessed when data of an intermediate cell of a NAND cell (e.g., the third cell data from the bit line contact of the NAND cell) is read out. If this is the case, after the access is completed it is possible to perform a rewrite action in a reverse order of the access. Alternatively, subsequent data of the NAND cell can be read out.

(Second Embodiment)

The present invention is applicable not only to a NAND cell but also to a sense amplifier arrangement in which one sense amplifier is shared by a plurality of bit lines in a memory cell system used in a conventional general-purpose DRAM. This second embodiment is illustrated in FIG. 17. The second embodiment is the same as the first embodiment except that a cell is not a NAND cell and a register cell is a 2-bit cell.

In this embodiment, one sense amplifier is shared by a plurality of bit lines, so it is possible to temporarily store a plurality of data in a register with respect to one sense amplifier as in cases where NAND cells are used. Also, as in the first embodiment, by alternately operating blocks data can be successively read out without being returned to a memory cell. Consequently, the effective page length can be increased.

(Third Embodiment)

In the first embodiment, it is assumed that NAND cells are used as memory cells. However, no register cells need to be used if NAND cells are not used. This third embodiment is shown in FIG. 18. In the third embodiment, instead of registers used in FIG. 17, bit lines are used to temporarily store data. For this purpose, control signals $\phi t0$ and $\phi t1$ for a transfer gate between the bit lines of a cell unit and the bit lines of a sense amplifier unit are divided into $\phi t0A$, $\phi t0B$, $\phi t1A$, and $\phi t1B$ in the column direction. With this arrangement, two sense amplifiers thus divided can operate independently of each other.

Figure 19:
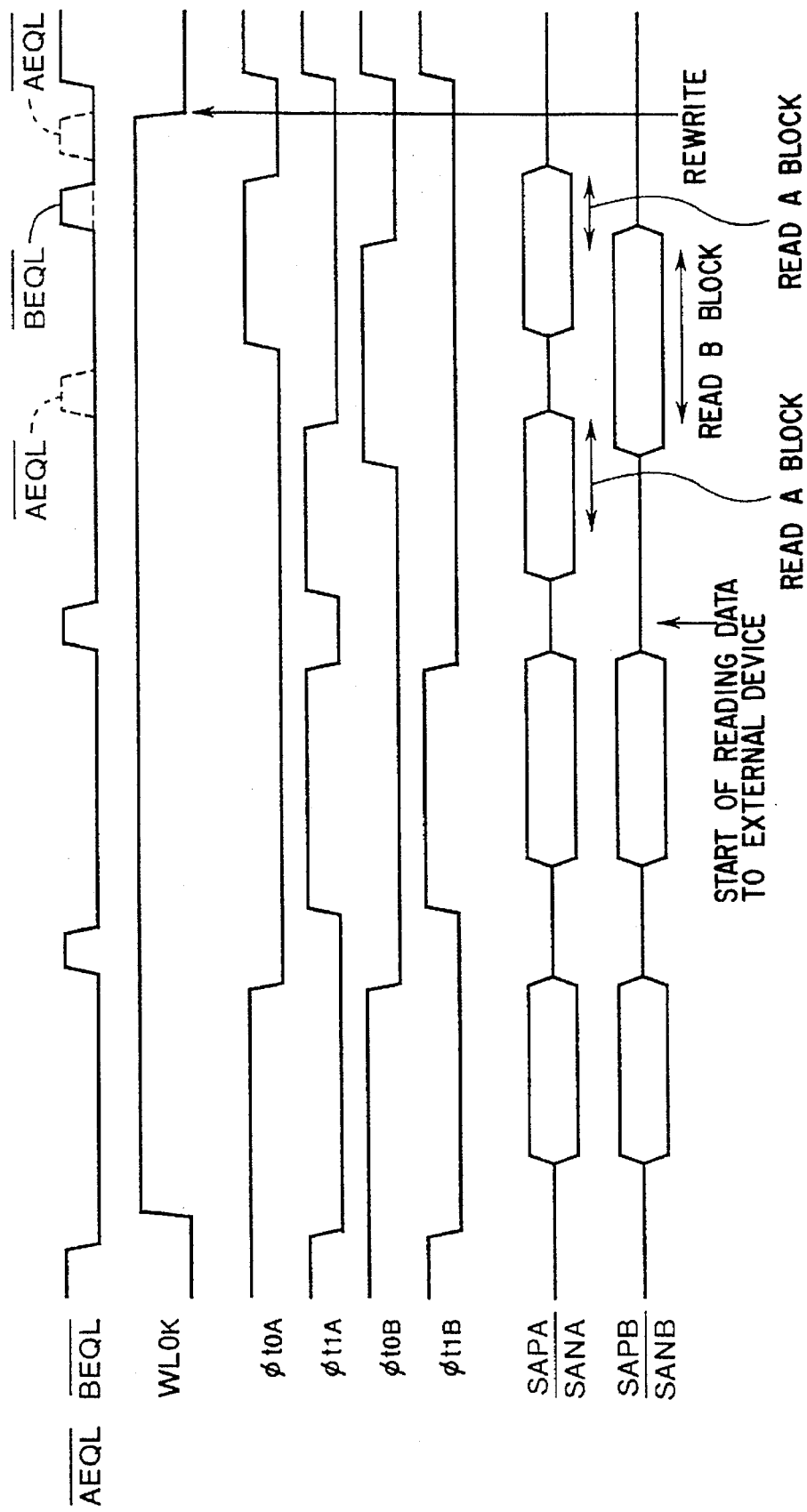
FIG. 19 is a timing chart showing read and write actions in the configuration shown in FIG. 18.

FIG. 19 is a timing chart of reads and writes in the configuration of this embodiment shown in FIG. 18. The level of an equalizer signal /BEQL is lowered to release an equalizer, and the levels of the transfer gate signals $\phi t1A$ and $\phi t1B$ are lowered to connect one bit line to each sense amplifier. Thereafter, the levels of word lines are raised to read out data from cells onto the bit lines, and the sense amplifiers are activated to amplify the data. The amplified signals are written back onto the bit lines onto which the signals are read out, and the levels of the signals $\phi t0A$ and $\phi t0B$ are lowered. At this time the readout data are temporarily stored on the bit lines onto which the data are read out. Subsequently, after bit lines of the sense amplifier unit are equalized, the levels of the signals $\phi t1A$ and $\phi t1B$ are raised to read out data onto remaining bit lines. In the same manner as when the first bit lines are read, the data are written back onto the bit lines onto which the data are read out.

Reading out the data to an external device can be performed in the same way as in the method shown in FIGS. 3A and 3B except that RWL is replaced with $\phi t$. Since $\phi t$ is divided into A and B, $\phi tA$ and $\phi tB$ can be operated independently of each other. Accordingly, while data is being output from a sense amplifier in the A block, data which is temporarily stored in a bit line corresponding to a sense amplifier in the B block can be again read out into the sense amplifier. Consequently, data can be successively read out whenever the blocks are switched, and this results in a doubled page length.

Figure 20:
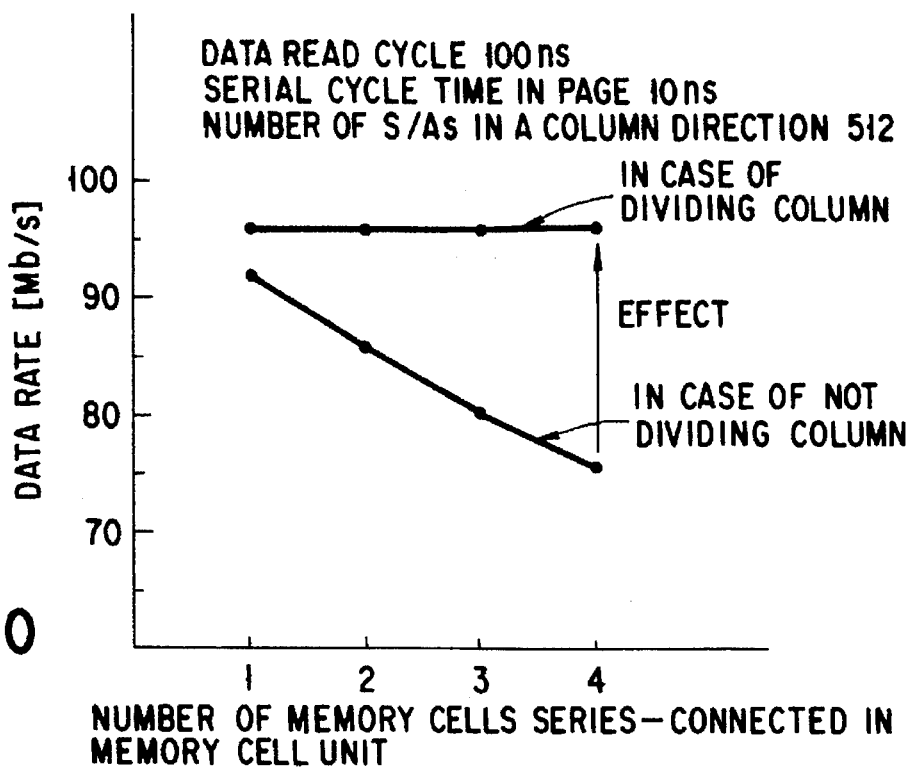
FIG. 20 is a graph showing the average data rate as a function of the number of cells series-connected in a memory cell unit.

Although the present invention is effective for both a general-purpose cell and a NAND cell as described above, the effect of the invention is greater in a NAND cell than in a general-purpose cell. FIG. 20 shows the average data rate as a function of the number of cells series-connected in a memory cell unit. The data rate can be represented as follows:

A/(A×B+C×D×E×F+G)

where A is the page length, B is the serial cycle time, C is the number of bit lines sharing one sense amplifier, D is the number of cells series-connected in a unit, E is read and rewrite, F is a cycle time in which data is read out from a NAND cell to a register or is rewritten from a register into a NAND cell, and G is the access time from a register.

Assuming the number of sense amplifiers is 512, the read serial cycle time B in a page is 10 ns, the read cycle time F from a NAND cell to a register is 100 ns, and the access time G from a register is 60 ns, the data rate is calculated by 512/(512×10 ns+2×D×2×100 ns+60 ns)

in case of not dividing column. Accordingly, when the number D of cells series-connected in a cell unit is increased, the overhead from the first read to the last rewrite is increased, and this lowers the data rate. However, in case of dividing column the page length A is

C×D×512.

Therefore, the data rate is calculated by

2×D×512/(512×10 ns+2×D×2×100 ns+60 ns).

That is, the data rate remains almost unchanged even if the number D of cells series-connected in a cell unit is increased. Accordingly, the effect of the present invention is enhanced by increasing the number of cells series-connected in a cell unit.

Figure 21A:
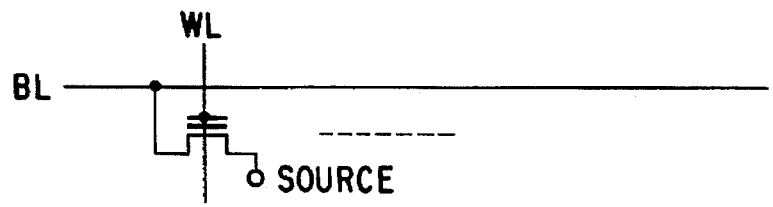
FIGS. 21A, 21B, and 21C are views showing examples of NOR, NAND, and AND memory cells, respectively, formed using nonvolatile memory cells.
Figure 21B:
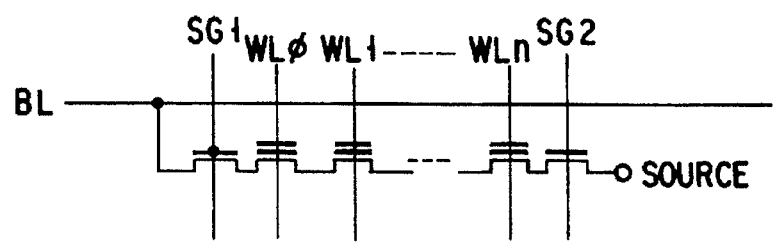
Figure 21C:
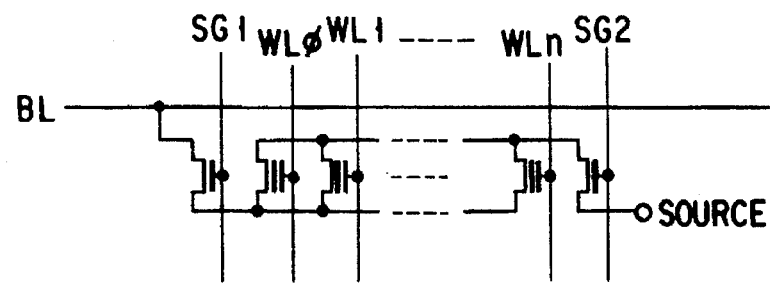

The above embodiments have been explained by taking a DRAM as an example. However, the present invention is applicable not only to a DRAM but also to a nonvolatile memory (e.g., an EEPRPOM). FIGS. 21A, 21B, and 21C are circuit diagrams of NOR, NAND, and AND memory cells, respectively, formed by connecting nonvolatile memory cells in series or parallel. These memory cells can be applied to the above embodiments, particularly to the memory cell array shown in FIG. 18.

The present invention is not limited to the above embodiments.

In each embodiment, one sense amplifier is shared by two pairs of bit lines. However, one sense amplifier can also be shared by three or more pairs of bit lines. Furthermore, in the first embodiment NAND cells are used, so a single NAND cell can store a plurality of data. Therefore, one sense amplifier need not be shared by a plurality of pairs of bit lines in the first embodiment. In the second and third embodiments, however, general-purpose cells are used instead of NAND cells. Accordingly, in these embodiments it is essential that one sense amplifier be shared by a plurality of pairs of bit lines. Also, in each embodiment the memory cells are dynamic cells, but static memory cells also can be used. The present invention is also applicable to a nonvolatile memory cell.

Moreover, the present invention can be practiced in the form of various modifications without departing from the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
    at least one memory array which has memory cells, word lines driven by a row decoder, and bit lines for reading data from said memory cells, said memory array further having a plurality of memory cell units which have a plurality of said memory cells connected together in series;
    a plurality of sense amplifiers provided to read out data from said memory cell units in said memory array, each of said plurality of sense amplifiers being formed into subsets of sense amplifier blocks with all of the sense amplifiers forming a given sense amplifier block being connected between a first data node and a second data node so as to amplify a signal difference between the first data node and the second data node, with at least said first data node of each of said plurality of sense amplifier blocks being selectively connected to at least one of said bit lines in said memory array when data is to be read or written;
    a plurality of register blocks corresponding to said plurality of sense amplifier blocks, each of said plurality of register blocks including a plurality of registers receiving and storing data amplified by said plurality of sense amplifiers; and
    a control circuit for independently controlling each of said plurality of Sense amplifier blocks and said plurality of register blocks to independently read out data from each of said plurality of register blocks.

2. A semiconductor memory device according to claim 1, wherein each of said plurality of registers temporarily stores data read out from said memory units, and
    said control circuit controls the reading out of data from said plurality of registers to an external device without any need to first return the data to said memory cell units.

3. A semiconductor memory device according to claim 1, further comprising:
    an input address executing device which selects a register in said plurality of register blocks in addition to responding to a row address and a column address.

4. A semiconductor memory device according to claim 3, wherein
    each of said plurality of registers temporarily stores data read out from said memory cell units, and
    said control unit controls the reading out of data from said plurality of registers to an external device without any need to first return the data to said memory cell units.

5. A device according to claim 1, wherein said plurality of registers in a register block are all connected to one of said first data node and said second data node of each of said plurality of sense amplifiers in the corresponding sense amplifier block.

6. A semiconductor memory device according to claim 1, further comprising a switching device which selectively connects said bit lines to one of said first data node and said second data node of each of said plurality of sense amplifiers.

7. A semiconductor memory device according to claim 1, wherein said plurality of memory cells and said plurality of registers respectively include dynamic memory cells.

8. A semiconductor memory device according to claim 1, wherein said plurality of memory cells are selected from the group consisting of NOR, NAND, and AND cells.

9. A semiconductor memory device comprising:

at least one memory array which has memory cells, word lines being driven by a row decoder and data from for reading data from said memory cells, said memory cells being provided at intersections of said bit lines and said word lines;

a plurality of sense amplifiers provided for said memory array to read out data from said memory cells in said memory array, said plurality of sense amplifiers forming subsets of plural sense amplifier blocks with all of the sense amplifiers in a sense amplifier block being connected between a first data node and a second data node so as to amplify a signal difference between the first data node and the second data node;

a plurality of switching array blocks corresponding to said plurality of sense amplifier blocks, said plurality of switching array blocks each having a plurality of switching elements which connect a pair of bit lines to said first node and to said second node of each of said plurality of sense amplifiers when data is to be read or written; and a control circuit for independently controlling each of said plurality of sense amplifier blocks and said corresponding plurality of said switching blocks to independently read out data from said memory cells in said memory array.

10. A semiconductor memory device comprising:

at least one memory array which has memory cells, word lines being driven by a row decoder and bit lines for reading data from said memory cells, said memory cells being provided at intersections of said bit lines and said word lines;

a plurality of sense amplifiers provided for said memory array to read out data from said memory cells in said memory array, said plurality of sense amplifiers forming subsets of plural sense amplifier blocks with all of the sense amplifiers in a sense amplifier block being connected between a first data node and a second data node so as to amplify a signal difference between the first data node and the second data node, with at least said first data node of each of said plurality of sense amplifier blocks being selectively connected to at least one of said bit lines in said memory array when data is to be read or written;

a plurality of register blocks corresponding to said plurality of sense amplifier blocks, each of said plurality of register blocks including a plurality of registers receiving and storing data amplified by said plurality of sense amplifiers; and a control circuit for independently controlling each of said plurality of sense amplifier blocks and said plurality of register blocks to independently read out data from each of said plurality of register blocks.

11. A semiconductor memory device comprising:

at least one memory array which has memory cells, word lines being driven by a row decoder and bit lines for reading data from said memory cells, said memory cells being provided at intersections of said bit lines and said word lines;

a plurality of sense amplifiers provided for said memory array to read out data from said memory cells in said memory array, said plurality of sense amplifiers forming subsets of plural sense amplifier blocks with all of the sense amplifiers in a sense amplifier block being connected between a first data node and a second data node so as to amplify a signal difference between the first data node and the second data node;

a plurality of register blocks corresponding to said plurality of sense amplifier blocks, each of said plurality of register blocks including a plurality of registers receiving and storing data amplified by said plurality of sense amplifiers;

a plurality of switching array blocks corresponding to said plurality of sense amplifier blocks, said plurality of switching array blocks each having a plurality of switching elements which selectively connect a pair of bit lines to said first node and said second node of each of said plurality of said sense amplifiers when data is read or written; and a control circuit for independently controlling each of said plurality of sense amplifier blocks, said plurality of switching array blocks, and said plurality of register blocks so as to independently read out data from each of said plurality of register blocks.

* * * * *